(12) United States Patent
Deak et al.

(10) Patent No.: US 10,228,426 B2
(45) Date of Patent: Mar. 12, 2019

(54) SINGLE CHIP Z-AXIS LINEAR MAGNETORESISTIVE SENSOR WITH CALIBRATION/INITIALIZATION COIL

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 4 days.

(21) Appl. No.: 15/542,324

(22) PCT Filed: Jan. 5, 2016

(86) PCT No.: PCT/CN2016/070137
§ 371 (c)(1),
(2) Date: Jul. 7, 2017

(87) PCT Pub. No.: WO2016/110244
PCT Pub. Date: Jul. 14, 2016

(65) Prior Publication Data
US 2018/0081000 A1    Mar. 22, 2018

(30) Foreign Application Priority Data
Jan. 7, 2015 (CN) .......................... 2015 1 0005952

(51) Int. Cl.
*G01R 33/00* (2006.01)
*G01R 33/02* (2006.01)
*G01R 33/09* (2006.01)

(52) U.S. Cl.
CPC ..... *G01R 33/0017* (2013.01); *G01R 33/0005* (2013.01); *G01R 33/0011* (2013.01);
(Continued)

(58) Field of Classification Search
CPC ... G01R 33/09; G01R 33/093; G01R 33/0017
See application file for complete search history.

(56) References Cited

U.S. PATENT DOCUMENTS

| | | | | |
|---|---|---|---|---|
| 2012/0200292 A1* | 8/2012 | Sugihara | ............... | B82Y 25/00 324/252 |
| 2013/0169271 A1 | 7/2013 | Nordman et al. | | |
| 2013/0300402 A1* | 11/2013 | Liu | ....................... | G01R 33/09 324/202 |

FOREIGN PATENT DOCUMENTS

| | | |
|---|---|---|
| CN | 103091647 | 5/2013 |
| CN | 103901363 | 7/2014 |

(Continued)

OTHER PUBLICATIONS

"International Application No. PCT/CN2016/070137, International Search Report and Written Opinion dated Mar. 28, 2016", (Mar. 28, 2016), 17 pgs.

*Primary Examiner* — Noam Reisner
(74) *Attorney, Agent, or Firm* — Schwegman Lundberg & Woessner, P.A.

(57) ABSTRACT

A single chip Z-axis linear magnetoresistive sensor with a calibration/initialization coil comprises a single chip Z-axis linear magnetoresistive sensor, and a calibration coil and/or an initialization coil. The calibration coil and the initialization coil are planar coils or three-dimensional coils. The planar coils are located above a substrate and below a magnetoresistive sensing unit, between a magnetoresistive sensing unit and a soft ferromagnetic flux concentrator, above a soft ferromagnetic flux concentrator, or in a gap of the soft ferromagnetic flux concentrator. The three-dimensional coil is wound around the soft ferromagnetic flux concentrator and the magnetoresistive sensing unit. The calibration coil and the initialization coil respectively comprise straight wires which are parallel to a magnetization (Continued)

direction of a pinned layer/free layer, wherein the calibration coil generates an equivalent calibration magnetic field parallel/anti-parallel to the direction of the pinned layer of a push or a pull magnetoresistive unit string, and the initialization coil generates a uniform initializing magnetic field in the direction of the free layer at all magnetoresistive sensing units. By controlling the current in the calibration coil/initialization coil, calibration and magnetic state initialization of the single chip Z-axis linear magnetoresistive sensor can be achieved. The sensor has advantages of being highly efficient, quick, and convenient.

14 Claims, 31 Drawing Sheets

(52) U.S. Cl.
CPC ......... *G01R 33/0206* (2013.01); *G01R 33/09* (2013.01); *G01R 33/093* (2013.01); *G01R 33/098* (2013.01)

(56) References Cited

FOREIGN PATENT DOCUMENTS

| | | |
|---|---|---|
| CN | 203838321 | 9/2014 |
| CN | 104569870 | 4/2015 |
| CN | 204347226 | 5/2015 |
| WO | WO-2016110244 | 7/2016 |

* cited by examiner

SINGLE CHIP Z-AXIS LINEAR MAGNETORESISTIVE SENSOR WITH CALIBRATION/INITIALIZATION COIL

PRIORITY CLAIM TO RELATED APPLICATIONS

This application is a U.S. national stage application filed under 35 U.S.C. § 371 from International Application Serial No. PCT/CN2016/070137, which was filed 5 Jan. 2016, and published as WO2016/110244 on 14 Jul. 2016, and which claims priority to China Application No. 201510005952.7, filed 7 Jan. 2015, which applications and publication are incorporated by reference as if reproduced herein and made a part hereof in their entirety, and the benefit of priority of each of which is claimed herein.

TECHNICAL FIELD

The invention relates to the field of magnetic sensors, and in particular, to a single chip Z-axis linear magnetoresistive sensor with a calibration/initialization coil.

BACKGROUND TECHNOLOGY

A Magnetic Tunnel Junction (MTJ) sensor is advantageous in terms of high sensitivity, small size, low cost, low power consumption, and the like. The MTJ sensor has high magnetoresistance, and it is compatible with standard semiconductor manufacturing processes; however, the method for preparing a high-performance MTJ linear magnetic field sensor has not yet been fully developed. In particular, it is difficult to effectively control the temperature dependence and hysteresis.

A magnetic field sensor is comprised of individual magnetoresistive elements. During actual application, the magnetoresistive elements are generally connected to form a bridge to eliminate offset, increase the sensitivity, and compensate temperature dependence. The bridge structure can compensate the temperature dependence to some extent; however, the dependence of the intrinsic magnetic performance of the magneto-resistor of the sensor on the temperature will not be completely suppressed. For high-precision measurement, it is necessary to calibrate the sensitivity under actual performance conditions, and this objective can be achieved by using a chip-level calibration coil to generate a magnetic field along the sensing direction of the sensor.

In addition, the magnetoresistive sensor is comprised of ferromagnetic sensing elements, and therefore, an output curve is non-linear. The generation of hysteresis is caused by the movement of domain walls within the sensing elements and other parts (e.g., a magnetic shielding layer or a flux concentrator layer). To overcome the above problems, a high-performance magnetoresistive sensor generally needs another coil to provide a periodic saturation field for the sensing elements in order to eliminate magnetic domains, and this coil is referred to as an initialization coil.

Patent No. 201310409446.5 publicized a single chip Z-axis linear magnetoresistive sensor, as shown in FIG. 1, for measuring an external magnetic field in a Z direction, i.e., a direction perpendicular to a substrate. The single chip Z-axis linear magnetoresistive sensor includes a substrate 1, a plurality of elongated soft ferromagnetic flux concentrators 2 located on the substrate 1 and having a length direction being a Y-axis direction and a width direction being an X-axis direction, and magnetoresistive sensing unit arrays 4 and 5 located on upper surfaces or lower surfaces of the soft ferromagnetic flux concentrators 2. The magnetoresistive sensing unit arrays are arranged into a push magnetoresistive unit string 4 and a pull magnetoresistive unit string 5 along the Y-axis direction, which are respectively located on two sides of a Y-axis center line 3 of the soft ferromagnetic flux concentrator 2, and have a same distance from the Y-axis center line. The push magnetoresistive unit string 4 and the pull magnetoresistive unit string 5 are electrically connected to form a push-pull bridge. A pinned layer direction and a magnetic field sensing direction of the magnetoresistive sensing unit are along the X-axis direction. When an external magnetic field is applied in the Z-axis direction, the soft ferromagnetic flux concentrators 2 distort the Z-direction magnetic field into two magnetic field components that have X-axis and −X-axis magnetic field components, that is oppositely oriented directions with identical amplitudes. The two sensing direction magnetic fields are applied to the push magnetoresistive string 4 and the pull magnetoresistive string 5, thereby forming a push-pull magnetoresistive sensor.

FIG. 2 is a cross-sectional diagram of the single chip Z-axis linear magnetoresistive sensor. It can be seen that, the push magnetoresistive sensing unit string 4 and the pull magnetoresistive sensing unit string 5 are located on the substrate 1. The soft ferromagnetic flux concentrators 2 are located above the push magnetoresistive sensing unit string 4 and the pull magnetoresistive sensing unit string 5. Moreover, the single chip Z-axis linear magnetoresistive sensor further includes an electrode 6; insulation layers 7 and 8 located between layers and configured to isolate the electrodes of the magnetoresistive sensing units and from the magnetoresistive sensing units 4, 5 and the soft ferromagnetic flux concentrators 2; and a passivation layer 9 configured to protect the whole device.

The magnetoresistive sensing unit strings 4 and 5 in the single chip Z-axis linear magnetoresistive sensor shown in FIG. 1 and FIG. 2 are TMR magnetoresistive sensing units, each including a free layer, a pinned layer, and a central barrier layer. An initial magnetization direction of the free layer is the Y-axis direction, and the magnetization direction of the pinned layer, that is, the magnetic field sensing direction, is the X-axis direction. The single chip Z-axis magnetoresistive sensor described above can effectively measure a Z-axis magnetic field component, but it has the following problems:

1) In a wafer test stage, a complex Z-direction external magnetic field generation system needs to be designed, including an electromagnetic coil and an electromagnetic coil power supply. Moreover, the electromagnetic coil system needs to move along with a probe platform, thereby increasing costs for measurement, and affecting the efficiency of measurement.

2) Application and positioning of a magnetic field of the electromagnetic coil system are imprecise, affecting the precision of measurement.

3) Magnetic domains exists in the soft ferromagnetic thin film of the free layer, and when an external magnetic field is applied, movement of the magnetic domains is irreversible. As a result, after the external magnetic field is removed, the ferromagnetic thin film of the free layer cannot return to its initial state. As a result, hysteresis is produced, making it hard to guarantee the repeatability of the sensor.

SUMMARY OF THE INVENTION

To solve the above problems, this invention provides a single chip Z-axis linear magnetoresistive sensor with a calibration/initialization coil. On the basis of the above single chip Z-axis linear magnetoresistive sensor structure, a calibration coil/initialization coil is fabricated on the chip, through which a sufficient current can pass. At positions where a push magnetoresistive sensing unit string and a pull magnetoresistive sensing unit string are located, current-induced magnetic fields having identical magnitudes are generated along an X direction and a −X direction respectively. The magnitude of the magnetic field may be precisely adjusted by adjusting the current. The calibration coil is located on the Z-axis sensor chip; therefore, during measurement, it is feasible to implement measurement by applying a current using a probe, thereby improving the efficiency and the precision of the measurement.

Likewise, when the Z-axis magnetoresistive sensor has an irreversible magnetization state change under the effect of an external magnetic field, a current may be provided through the initialization coil, and an external magnetic field along the initial magnetization direction of the free layer is generated at all magnetoresistive sensing units, thereby restoring the magnetization state of the free layer, and eliminating the influence on the magnetization state of the soft magnetic thin film due to the magnetic field exposure history.

A single chip Z-axis linear magnetoresistive sensor with a calibration/initialization coil according to the invention includes a single chip Z-axis linear magnetoresistive sensor, and a calibration coil or/and an initialization coil. The single chip Z-axis linear magnetoresistive sensor includes a soft ferromagnetic flux concentrator for distorting a Z-direction magnetic field into two sensing direction magnetic fields that have opposite directions and identical amplitudes and have magnetic field components in X-axis and −X-axis directions, and an array including a plurality of magnetoresistive units. The plurality of magnetoresistive units forms a push magnetoresistive sensing unit string and a pull magnetoresistive sensing unit string.

The calibration coil/initialization coil respectively includes straight wires that are parallel to a magnetization direction of a pinned layer/free layer of a magnetoresistive sensing unit of the single chip Z-axis linear magnetoresistive sensor.

The calibration coil generates an equivalent calibration magnetic field parallel/anti-parallel to the direction of the pinned layer at the push/pull magnetoresistive sensing unit string of the single chip Z-axis linear magnetoresistive sensor. The initialization coil generates a uniform initializing magnetic field in the magnetization direction of the free layer at all magnetoresistive sensing units of the single chip Z-axis linear magnetoresistive sensor.

The calibration coil is a planar coil. The straight wires of the planar calibration coil are one-to-one corresponding to the push magnetoresistive sensing unit strings and the pull magnetoresistive sensing unit strings, and are located on the same side of a Y-axis center line of the soft ferromagnetic flux concentrator as the push magnetoresistive sensing unit strings and the pull magnetoresistive sensing unit strings respectively. The straight wires corresponding to the push magnetoresistive sensing unit strings and the straight wires corresponding to the pull magnetoresistive sensing unit strings have currents in opposite directions.

A distance between the straight wire of the planar calibration coil and the Y-axis center line of the soft ferromagnetic flux concentrator is 0 to ($\frac{1}{2}$*Lx+$\frac{1}{2}$*Lgap), wherein Lx is the width of the flux concentrator, and Lgap is the width of a gap between the flux concentrators.

When the distance between the straight wire of the planar calibration coil and the Y-axis center line is 0 to $\frac{1}{2}$*Lx, the planar coil is located above a substrate of the single chip Z-axis linear magnetoresistive sensor and below a magnetoresistive sensing unit, between a magnetoresistive sensing unit and a soft ferromagnetic flux concentrator, or above a soft ferromagnetic flux concentrator.

When the distance between the straight wire of the planar calibration coil and the Y-axis center line is $\frac{1}{2}$*Lx to ($\frac{1}{2}$*Lx+$\frac{1}{2}$*Lgap), the planar coil is located above a substrate of the single chip Z-axis linear magnetoresistive sensor and below a magnetoresistive sensing unit, between a magnetoresistive sensing unit and a soft ferromagnetic flux concentrator, or in a gap between the soft ferromagnetic flux concentrators.

The calibration coil is a three-dimensional calibration coil that is wound around the soft ferromagnetic flux concentrator and the magnetoresistive sensing unit.

The three-dimensional calibration coil includes a plurality of three-dimensional calibration sub-coils connected in series. Each of the soft ferromagnetic flux concentrator, the push magnetoresistive sensing unit string, and the pull magnetoresistive sensing unit string corresponds to one of the three-dimensional calibration sub-coils.

The three-dimensional calibration sub-coils include a first group of straight wires and a second group of straight wires that are parallel to the Y-axis center line of the soft ferromagnetic flux concentrator. The first group of straight wires and the second group of straight wires are symmetrically distributed on two sides of the Y-axis center line of the soft ferromagnetic flux concentrator. The first group/second group of straight wires includes two straight wires. The two straight wires of the first group/second group of straight wires are respectively located on the surfaces of the soft ferromagnetic flux concentrator or the push magnetoresistive sensing unit string and the pull magnetoresistive sensing unit string. One straight wire in the first group of straight wires and one straight wire in the second group of straight wires are symmetric to the Y-axis center line and are distributed in an area between the push and pull magnetoresistive sensing unit strings. The other straight wire in the first group of straight wires and the other straight wire in the second group of straight wires are symmetric to the Y-axis center line and are distributed in an area external to the push and pull magnetoresistive sensing unit strings. The first group of straight wires and the second group of straight wires on the two sides of the Y-axis center line each form a three-dimensional solenoid coil.

The two three-dimensional solenoid coils have opposite winding directions, and are connected in series to each other. One of the three-dimensional solenoid coils generates a magnetic field parallel to the X-direction, and the other one generates a magnetic field in a −X direction.

The initialization coil is a planar initialization coil. The planar initialization coil includes a plurality of serially connected straight wires perpendicular to the Y-axis center line of the soft ferromagnetic flux concentrator. The straight wires are located right above or right below a magnetoresistive unit row of the Z-axis linear sensor along the X-axis direction, and have identical current directions.

The initialization coil is a three-dimensional initialization coil. The three-dimensional initialization coil includes a plurality of first groups of straight wires and second groups of straight wires that are parallel to a magnetoresistive unit row of the magnetoresistive sensing unit array along the X-axis direction. The first group of straight wires and the second group of straight wires are respectively located on the surfaces of the soft ferromagnetic flux concentrators and the magnetoresistive units. The first group of straight wires and the second group of straight wires have opposite current directions, and are connected to form a solenoid coil.

The initialization coil and the calibration coil are made of high-conductivity materials, such as Cu, Au, and Ag.

The initialization coil/calibration coil and the single chip Z-axis magnetoresistive sensor are isolated by using electrical insulation materials. The insulation materials are $SiO_2$, $Al_2O_3$, $Si_3N_4$, polyimide, or photoresist.

The calibration coil includes a positive port and a negative port. When a current passes through the two ports, the amplitude of a calibration magnetic field generated thereby is within a linear working area of the push magnetoresistive sensing unit string and the pull magnetoresistive sensing unit string.

The current of the calibration coil may be set to a single current value, or a plurality of current values.

The initialization coil includes two ports, and the magnitude of the initializing magnetic field is higher than a saturated magnetic field value of the free layer.

The current in the initialization coil is a pulse current or a DC current.

DETAILED DESCRIPTION

The invention will be described in detail with reference to the accompanying drawings and in combination with the following embodiments.

Embodiment 1

Figure 1:
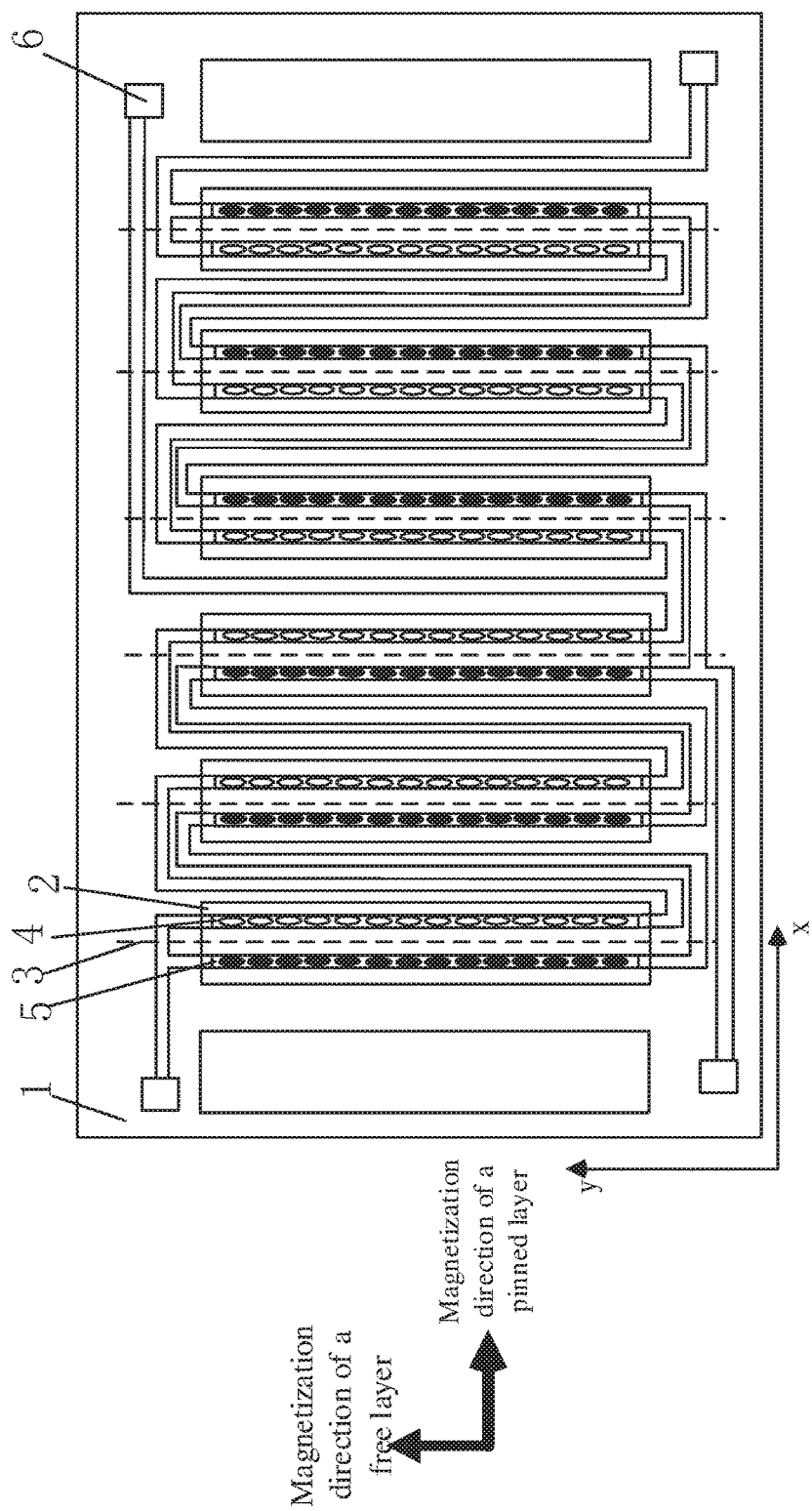
FIG. 1 is a structural diagram of a single chip Z-axis linear magnetoresistive sensor.
Figure 2:
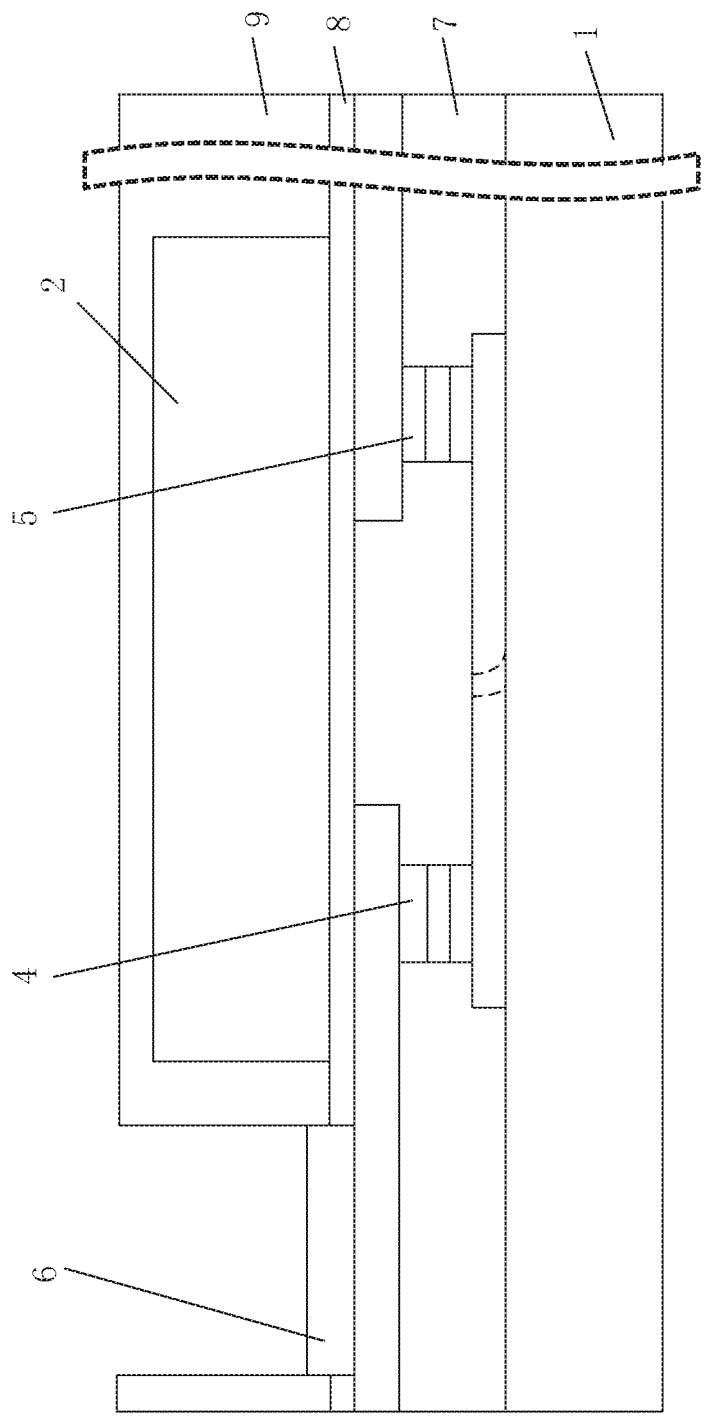
FIG. 2 is a cross-sectional diagram of a single chip Z-axis linear magnetoresistive sensor.
Figure 3:
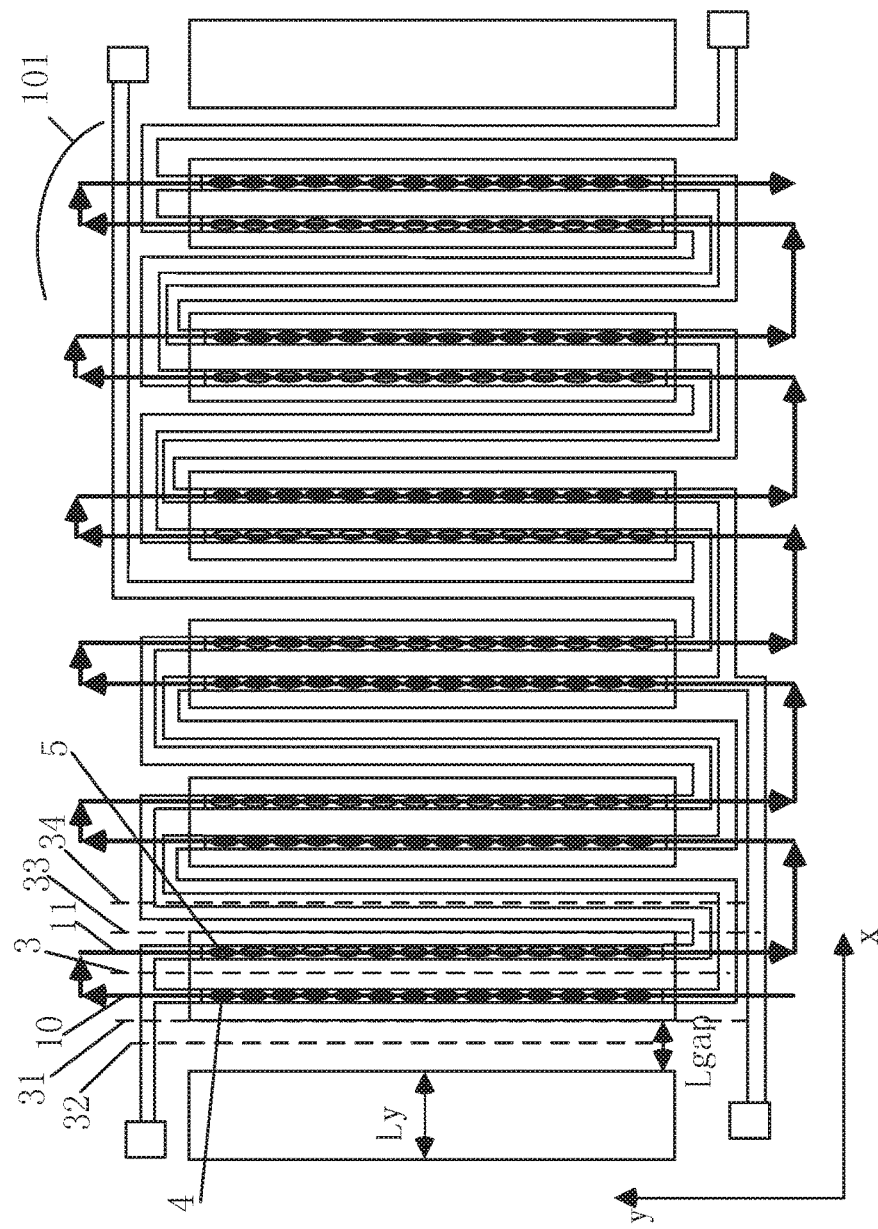
FIG. 3 shows a first pattern of a planar calibration coil.
Figure 4:
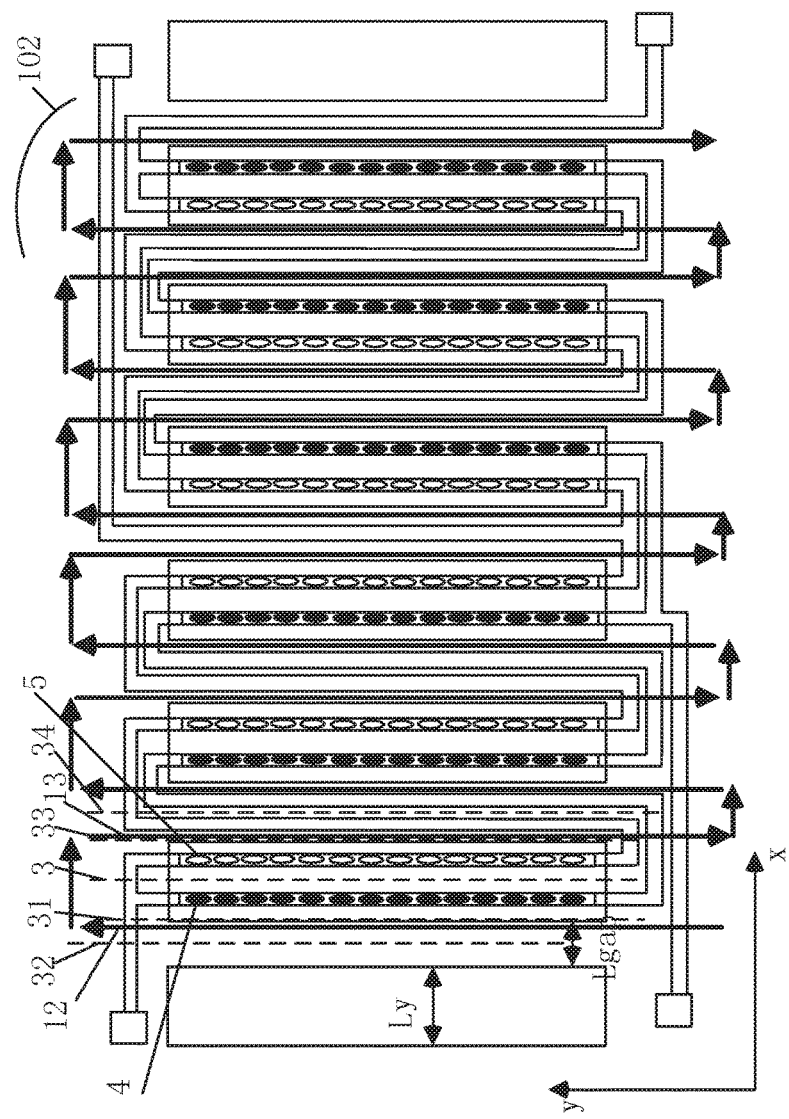
FIG. 4 shows a second pattern of a planar calibration coil.

FIG. 3 and FIG. 4 are respectively two structural distribution diagrams of planar calibration coils 101 and 102 on the single chip Z-axis magnetoresistive sensor. The planar calibration coils 101 and 102 include a plurality of straight wires 10, 11, 12 and 13 parallel to a Y-axis center line 3 of the soft ferromagnetic flux concentrator. The straight wires 10, 11, 12, and 13 are located on the two sides of the Y-axis center line 3 of the soft ferromagnetic flux concentrator. The straight wires 10 and 12 are located on the same side as the push magnetoresistive sensing unit string 4 and are one-to-one corresponding to the push magnetoresistive sensing unit string 4. The straight wires 11 and 13 are located on the same side as the pull magnetoresistive sensing unit string 5 and are one-to-one corresponding to the pull magnetoresistive sensing unit string 5. Moreover, in FIG. 3, the straight wire 10 corresponding to the push magnetoresistive sensing unit string 4 and the straight wire 11 corresponding to the pull magnetoresistive sensing unit string 5 have the same distance with respect to the Y-axis center line 3. In FIG. 4, the straight wire 12 corresponding to the push magnetoresistive sensing unit string 4 and the straight wire 13 corresponding to the pull magnetoresistive sensing unit string 5 also have the same distance with respect to the Y-axis center line 3.

All the straight wires located on one of the two sides of the Y-axis center line of the soft ferromagnetic flux concentrator have the same current direction, and all of the straight wires located on opposite sides have opposite current directions. The straight wire 10 and the straight wire 11 in FIG.

3, as well as the straight wire 12 and the straight wire 13 in FIG. 4 have opposite current directions.

The distances between all the straight wires and the Y-axis center line are 0 to (½*Lx+½*Lgap). Further, all the straight wires may be located in an area where the soft ferromagnetic flux concentrator is located, that is, the distances between all the straight wires and the Y-axis center line are 0 to ½*Lx, that is, all the straight wires are located in areas between 3 and 31 and between 3 and 33.

In the planar calibration coil structure corresponding to FIG. 3, the straight wires 10 and 11 are directly located right above or right below the push magnetoresistive sensing unit string 4 and the pull magnetoresistive sensing unit string 5.

In the planar calibration coil corresponding to FIG. 4, the straight wire is located in a gap between the soft ferromagnetic flux concentrators, that is, the distance between the straight wire and the Y-axis center line is ½*Lx to (½*Lx+½*Lgap). As shown in FIG. 4, the straight wires 12 and 13 are located in gaps on two sides of the flux concentrator, that is, located in areas between 31 and 32 and between 33 and 34.

Figure 5:
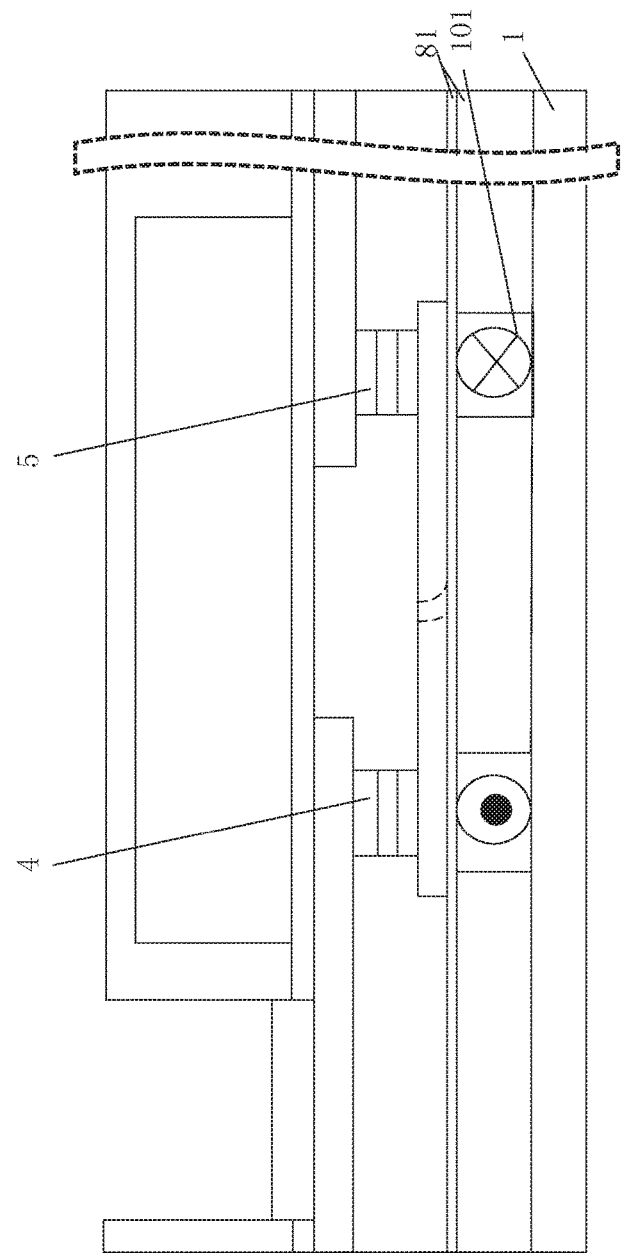
FIG. 5 shows a first position of a planar calibration coil.
Figure 6:
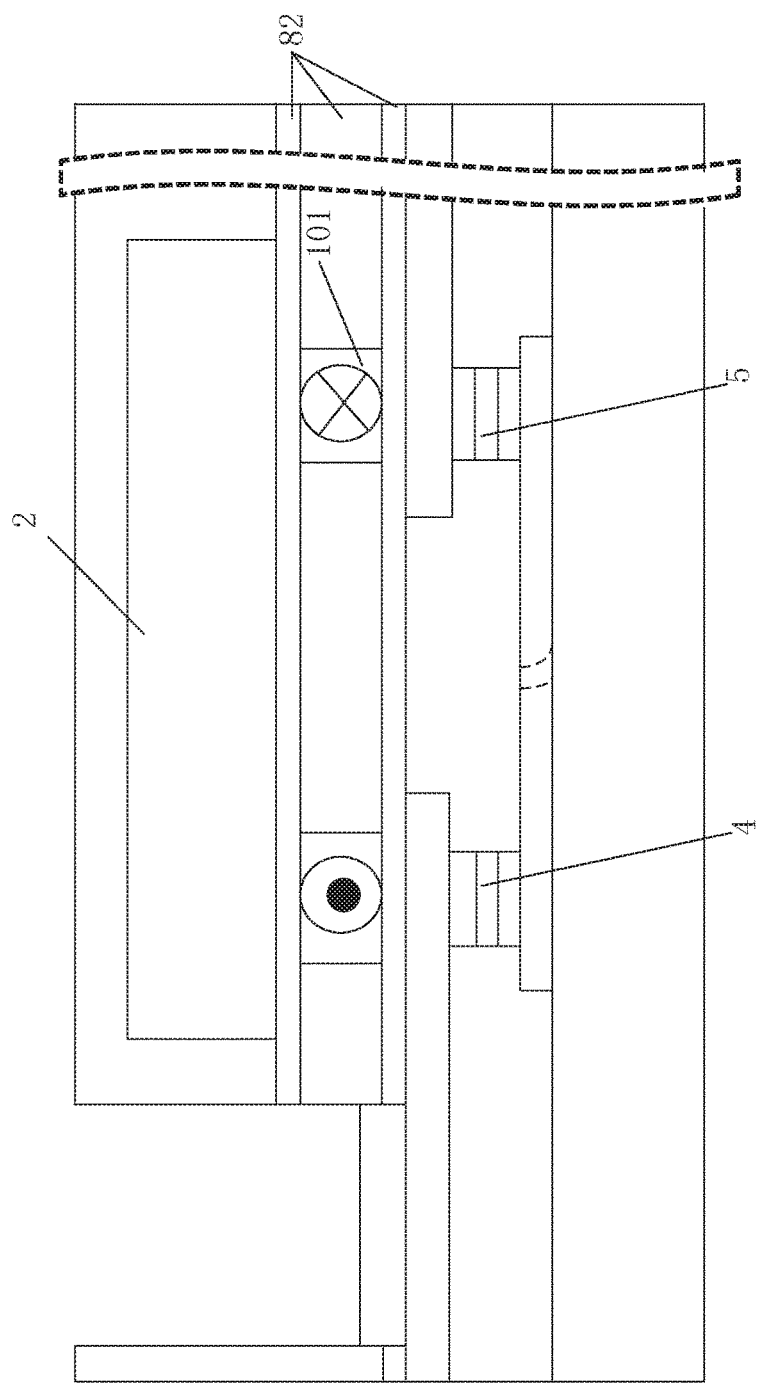
FIG. 6 shows a second position of a planar calibration coil.
Figure 7:
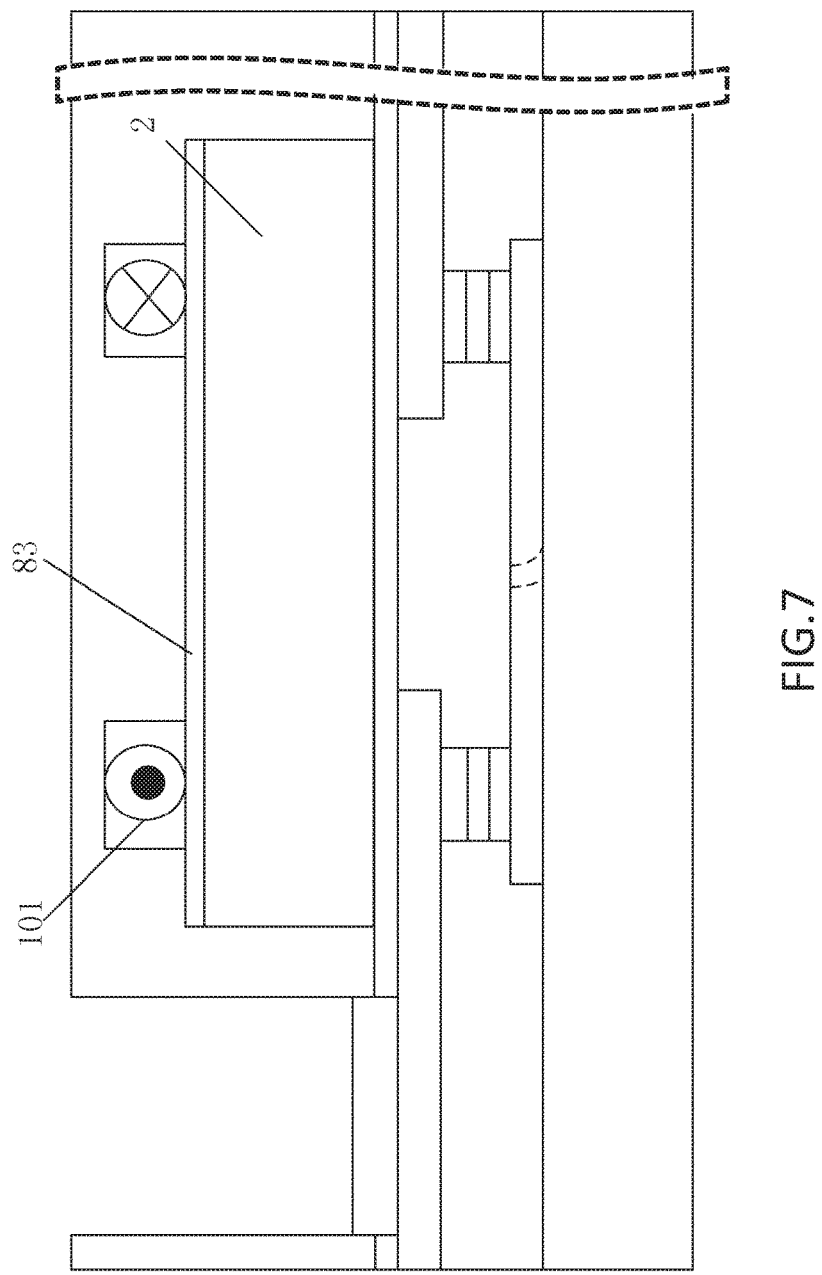
FIG. 7 shows a third position of a planar calibration coil.

FIG. 5 to FIG. 8 are cross-sectional diagrams of possible positions of the planar calibration coils 101 and 102 on the single chip Z-axis magnetoresistive sensor. By using the distance between the straight wire of the planar calibration coil 101 and the Y-axis center line being 0 to ½*Lx shown in FIG. 3 as an example, the planar calibration coil 101 may be located above the substrate 1 and between the push and pull magnetoresistive sensing unit strings 4 and 5 as shown in FIG. 5, between the soft ferromagnetic flux concentrator 2 and the push and pull magnetoresistive sensing unit strings 4 and 5 as shown in FIG. 6, and above the soft ferromagnetic flux concentrator 2 as shown in FIG. 7. Correspondingly, insulation layers 81, 82 and 83 are introduced respectively to electrically isolate the planar calibration coil 101 from peripheral layers.

Figure 8:
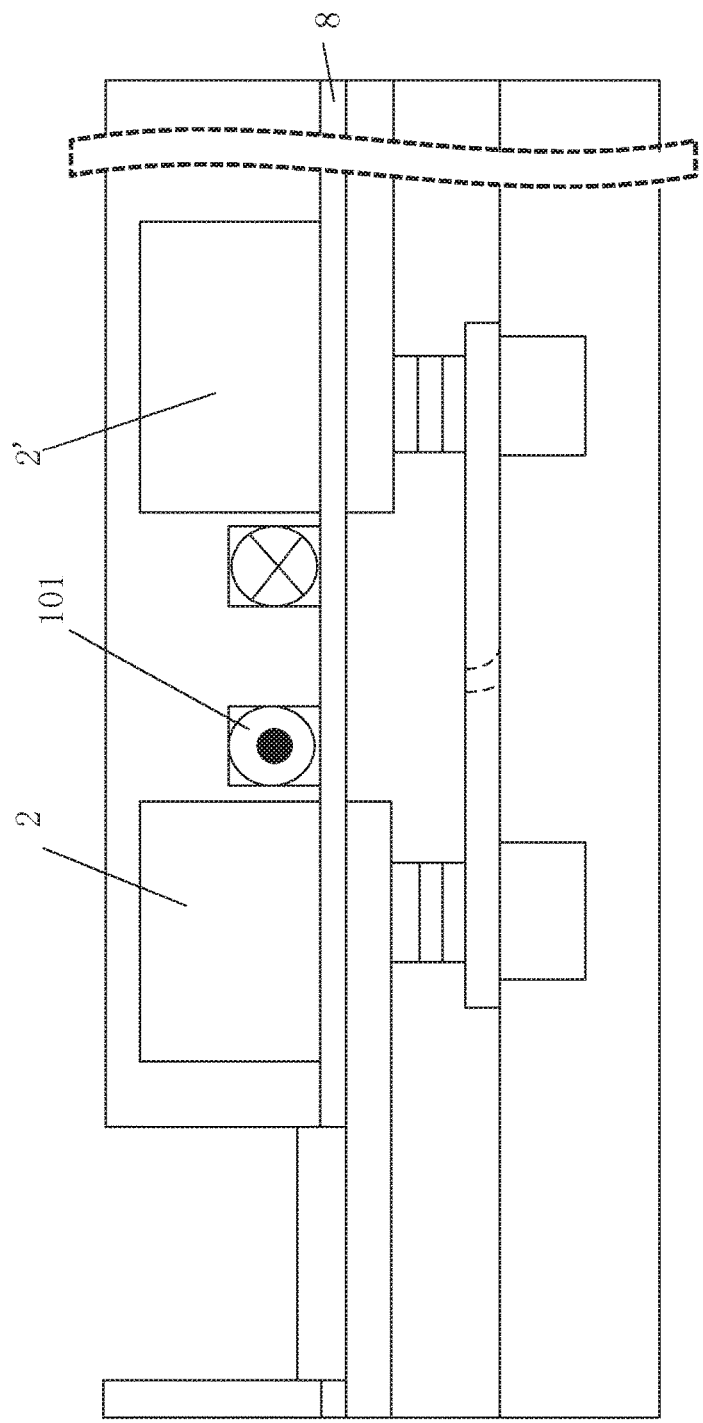
FIG. 8 shows a fourth position of a planar calibration coil.

By using the distance between the straight wire of the planar calibration coil 102 and the Y-axis center line being ½*Lx to (½*Lx+½*Lgap) shown in FIG. 4 as an example, in addition to being located above the substrate 1 and between the push and pull magnetoresistive sensing unit strings 4 and 5 as shown in FIG. 5, and being located between the soft ferromagnetic flux concentrator 2 and the push and pull magnetoresistive sensing unit strings 4 and 5 as shown in FIG. 6, the planar calibration coil 102 may further be located above the push and pull magnetoresistive sensing unit strings and in a gap between the soft ferromagnetic flux concentrators 2 and 2' as shown in FIG. 8.

Figure 9:
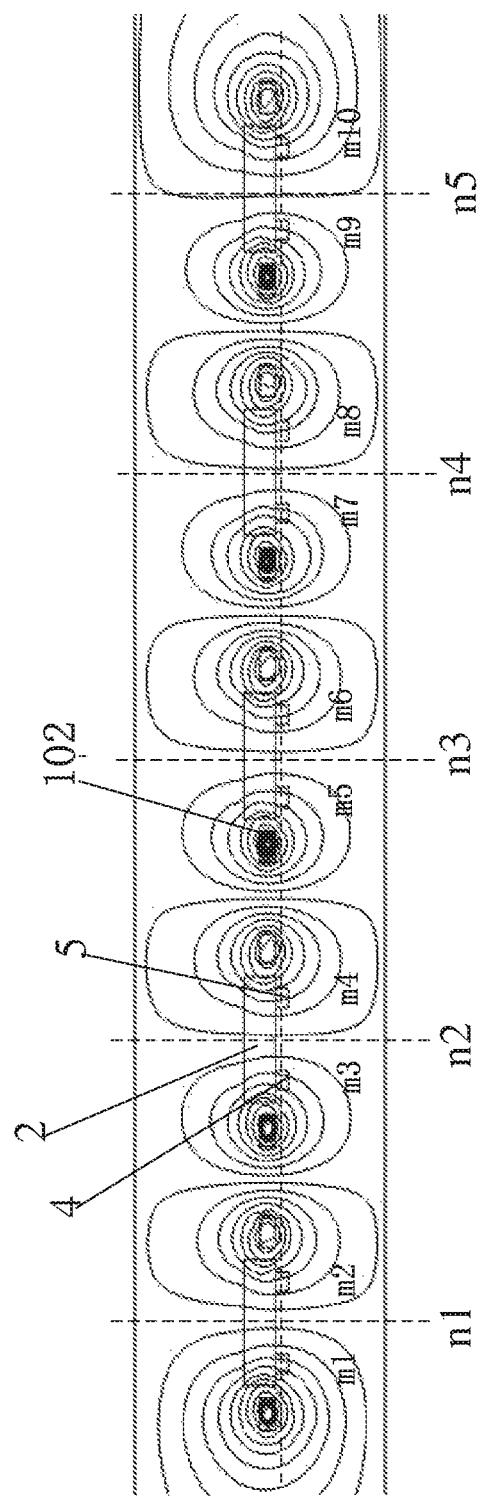
FIG. 9 is a first distribution diagram of magnetic field lines of a planar calibration coil on a single chip Z-axis magnetoresistive sensor.
Figure 10:
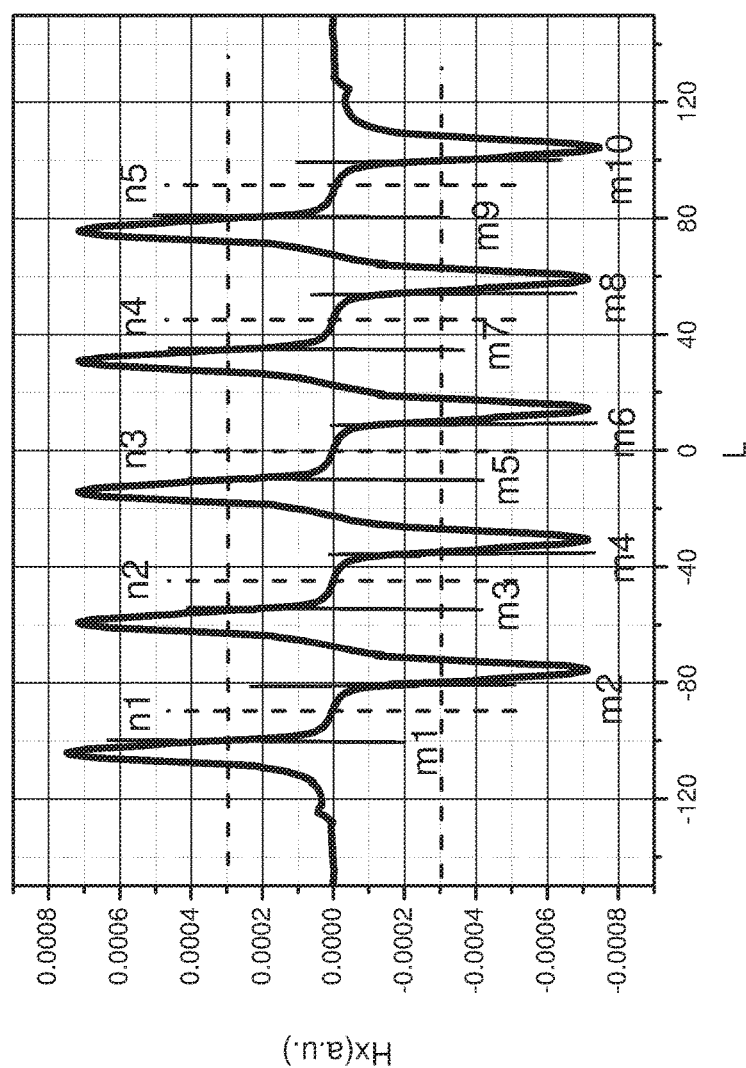
FIG. 10 is a first distribution diagram of an X-direction magnetic field of a planar calibration coil at the position of a magnetoresistive sensing unit.

FIG. 9 and FIG. 10 respectively show the distribution of magnetic field lines of a magnetic field generated by the planar calibration coil 102 shown in FIG. 4 on the single chip Z-axis magnetoresistive sensor, and the distribution of magnetic field components of the magnetic field along the X direction at the push magnetoresistive sensing unit string and the pull magnetoresistive sensing unit string. The straight wires are located in a gap between two adjacent soft ferromagnetic flux concentrators 2. The straight wires located at the push magnetoresistive sensing unit string 4 and the pull magnetoresistive sensing unit string 5 respectively generate two circumferential distributions of magnetic field lines in opposite directions. The circumferential magnetic field lines pass through the soft ferromagnetic flux concentrators 2 and reach the push magnetoresistive sensing unit string 4 and the pull magnetoresistive sensing unit string 5, wherein n1-n5 respectively correspond to central positions of the soft ferromagnetic flux concentrators 2, and m1-m10 respectively correspond to positions of the push magnetoresistive sensing unit strings and the pull magnetoresistive sensing unit strings. It can be seen from FIG. 10 that, X-direction magnetic field components at central positions of the flux concentrators 2, that is, positions n1-n5, are 0; while the push magnetoresistive sensing unit string 4 and the pull magnetoresistive sensing unit string 5 located at the surface of the flux concentrator 2 have opposite X-direction magnetic field components. That is, m1 and m2 have identical magnitudes and opposite directions, m3 and m4 have identical magnitudes and opposite directions, m5 and m6 have identical magnitudes and opposite directions, m7 and m8 have identical magnitudes and opposite directions, and m9 and m10 have identical magnitudes and opposite directions.

Figure 11:
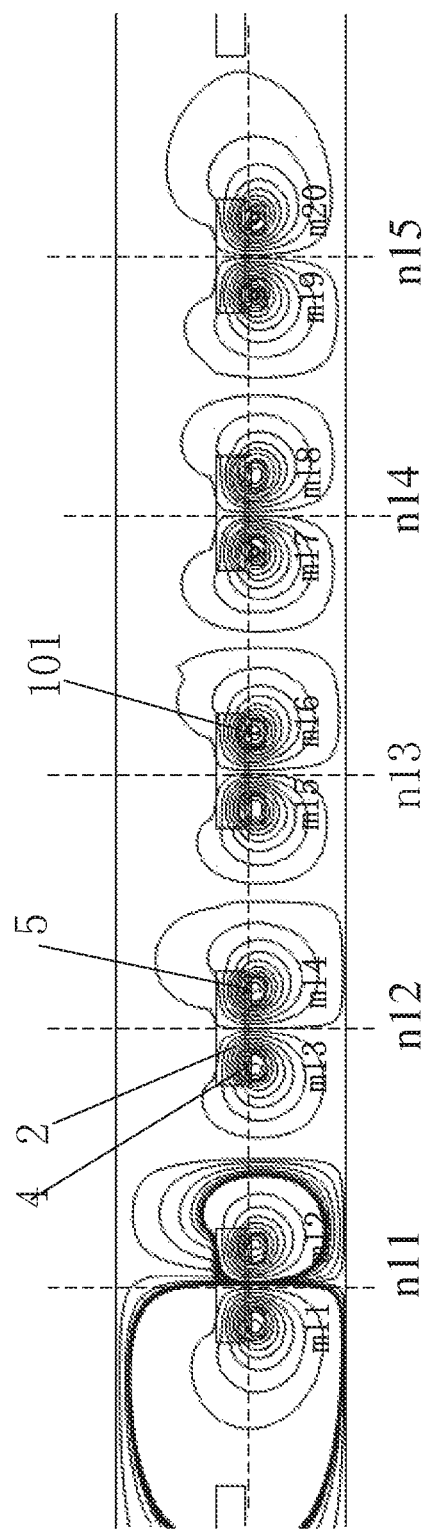
FIG. 11 is a second distribution diagram of magnetic field lines of a planar calibration coil on a single chip Z-axis magnetoresistive sensor.
Figure 12:
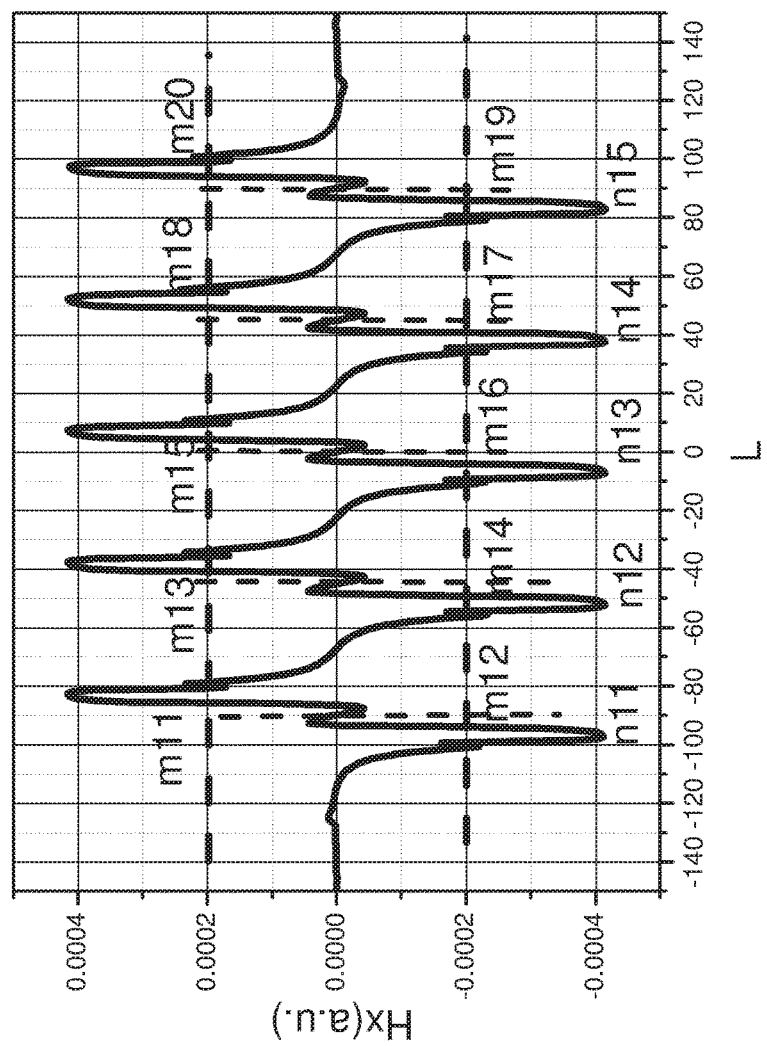
FIG. 12 is a second distribution diagram of an X-direction magnetic field of a planar calibration coil at the position of a magnetoresistive sensing unit.

FIG. 11 and FIG. 12 as well as FIG. 13 and FIG. 14 respectively show distribution of magnetic field lines and distribution of X-direction magnetic field components at the position of the sensor when the planar calibration coil 101 shown in FIG. 3 is located below the surfaces of the push magnetoresistive sensing unit string 4 and the pull magnetoresistive sensing unit string 5 and located above the surface of the soft ferromagnetic flux concentrator 2.

It can be seen that, in FIG. 11, the planar calibration coil 101 is located at a position right below the push magnetoresistive sensing unit string 2 and the pull magnetoresistive sensing unit string 4, n11-n15 are respectively central positions of the soft ferromagnetic flux concentrators 2, and m11-m20 are respectively push magnetoresistive sensing unit strings and pull magnetoresistive sensing unit strings. In FIG. 12, at the position of the magnetoresistive sensing unit and parallel to the X direction, X-direction magnetic field components of n11-n15 are 0; while the push magnetoresistive sensing unit m11 and the pull magnetoresistive sensing unit m12, as well as m13 and m14, m15 and m16, m17 and m18, and m19 and m20 have X-direction magnetic field components of identical magnitudes and opposite directions.

Figure 13:
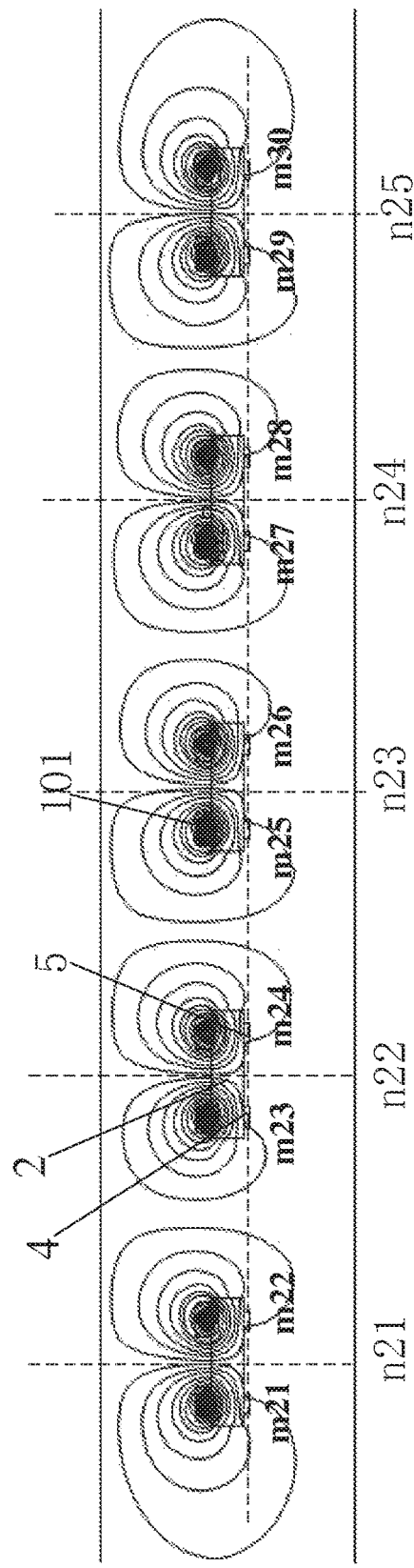
FIG. 13 is a third distribution diagram of magnetic field lines of a planar calibration coil on a single chip Z-axis magnetoresistive sensor.
Figure 14:
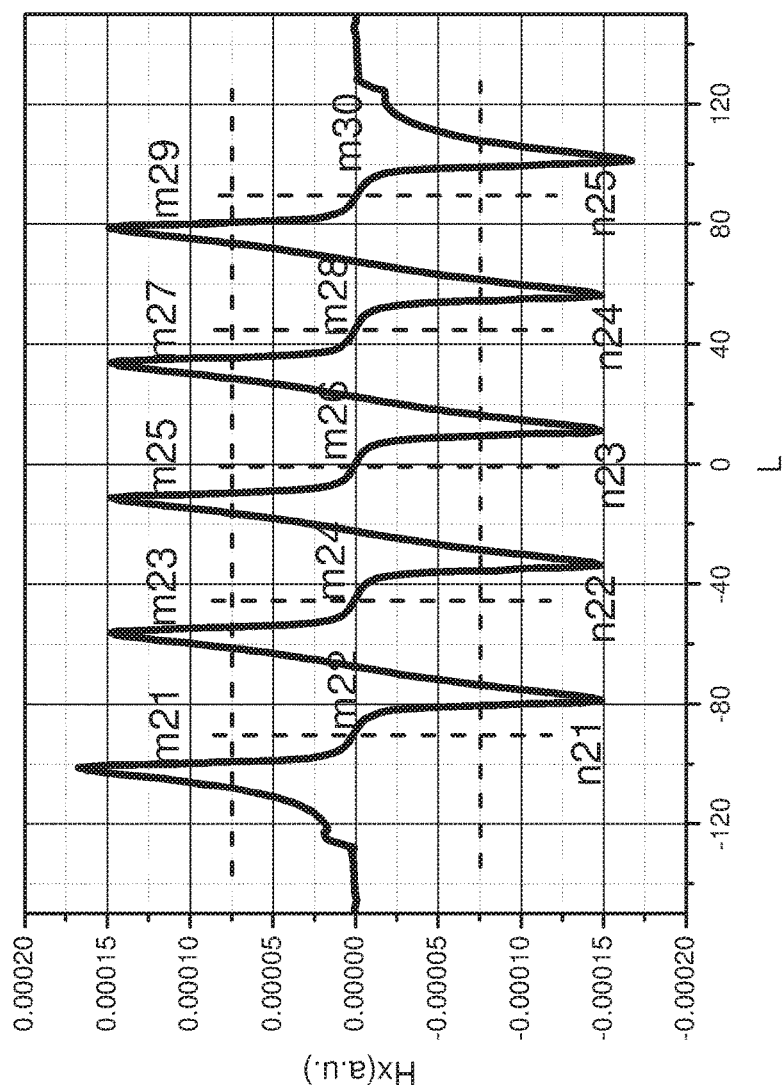
FIG. 14 is a third distribution diagram of an X-direction magnetic field of a planar calibration coil at the position of a magnetoresistive sensing unit.

In FIG. 13, the planar calibration coil 101 is located above the surface position of the soft ferromagnetic flux concentrator 2 and corresponds to the push magnetoresistive sensing unit string 4 and the pull magnetoresistive sensing unit string 5 respectively, n21-25 are respectively central positions of the soft ferromagnetic flux concentrators 2, m21-25 are respectively push magnetoresistive sensing unit strings and pull magnetoresistive sensing unit strings. In FIG. 14, at the position of the magnetoresistive sensing unit string, X-direction magnetic field components at n21-n25 are 0; while the push magnetoresistive unit 4 and the pull magnetoresistive unit 5, that is, m21 and m22, m23 and m24, m25 and m26, m27 and m28, and m29 and m30 have X-direction magnetic field components of identical magnitudes and opposite directions. In the two cases, the magnetic field lines form two annular rings with the straight wires as centers. Definitely, when the straight wire is located below the soft ferromagnetic flux concentrator as shown in FIG. 11, the X-direction magnetic field component generated at the position of the sensor is obviously greater than the X-direction magnetic field component when the straight wire is located above the soft ferromagnetic flux concentrator as shown in FIG. 13.

Therefore, the planar calibration coil may implement magnetic fields of the push magnetoresistive sensing unit string and the pull magnetoresistive sensing unit string having opposite directions and identical magnitudes by adjusting the current, thereby replacing a Z-direction external magnetic field, and implementing calibration on the single chip Z-axis magnetoresistive sensor.

Embodiment 2

Figure 15:
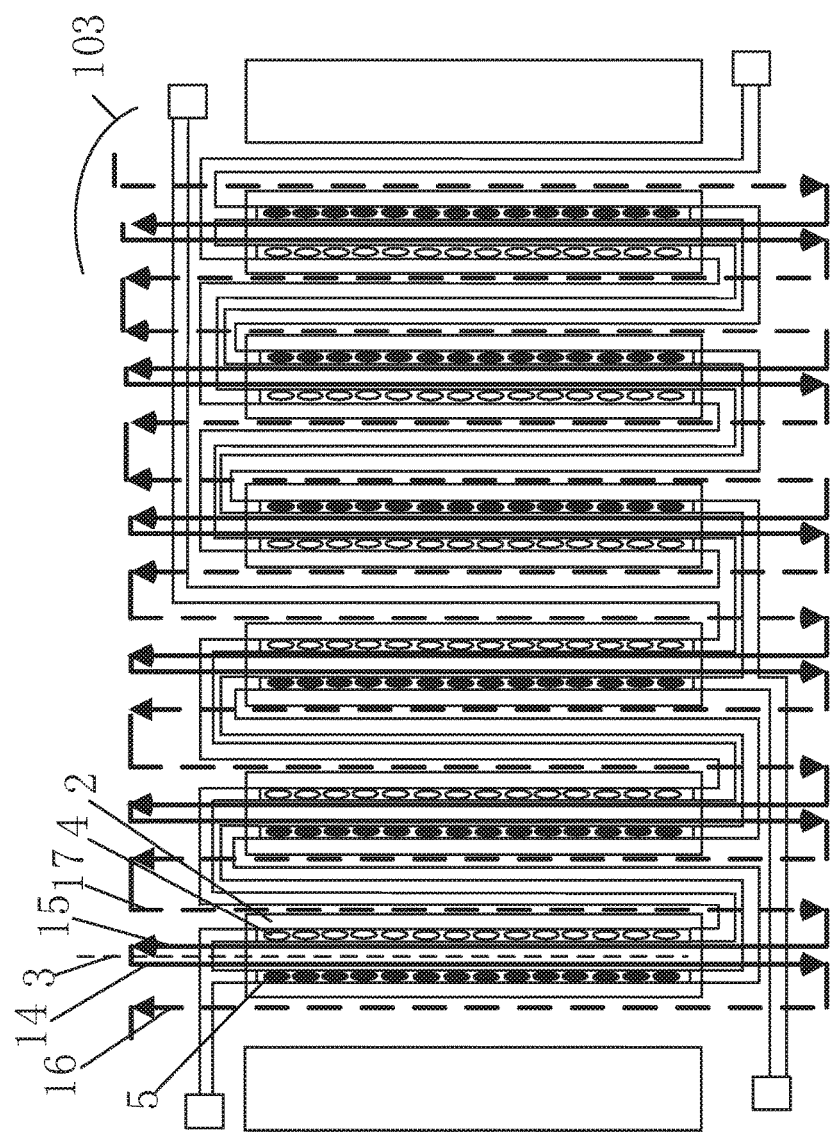
FIG. 15 is a structural diagram of a three-dimensional calibration coil.

FIG. 15 is a structural diagram of a three-dimensional calibration coil 103. It can be seen that there is a three-dimensional calibration sub-coil corresponding to each of a push magnetoresistive sensing unit string 5, a pull magnetoresistive sensing unit string 4, and a soft ferromagnetic flux concentrator 2 located on the surface thereof, and the three-dimensional calibration sub-coils are connected in series to each other.

Each of the three-dimensional coils includes a first group of straight wires and a second group of straight wires parallel to a Y-axis center line 3 of the soft ferromagnetic flux concentrator. The first group of straight wires and the second group of straight wires are symmetrically distributed on two sides of the Y-axis center line 3 of the corresponding soft ferromagnetic flux concentrator. Straight wires 14 and 16 form the first group of straight wires, and straight wires 15 and 17 form the second group of straight wires. The straight wires 14 and 15 are located on the surfaces of the soft ferromagnetic flux concentrator/push and pull magnetoresistive sensing unit strings and located in an area between the push magnetoresistive sensing unit string 5 and the pull magnetoresistive sensing unit string 4, and are symmetric with respect to the Y-axis center line 3.

The straight wires 16 and 17 are located on the surfaces of the push and pull magnetoresistive sensing unit strings/soft ferromagnetic flux concentrators and located at outer sides of the push magnetoresistive sensing unit string 5 and the pull magnetoresistive sensing unit string 4, and are symmetric with respect to the Y-axis center line 3. The two groups of straight wires located at two sides of the Y-axis center line 3 each form a solenoid coil, and the solenoid coils are connected in series and have opposite winding directions. In this way, the three-dimensional calibration sub-coil generates magnetic fields having identical magnitudes in an X direction and a −X direction at the push magnetoresistive sensing unit string 5 and the pull magnetoresistive sensing unit string 4 respectively. Moreover, due to the soft ferromagnetic flux concentrator, the current needed in the coil is greatly reduced, thus reducing the power consumption.

Figure 16:
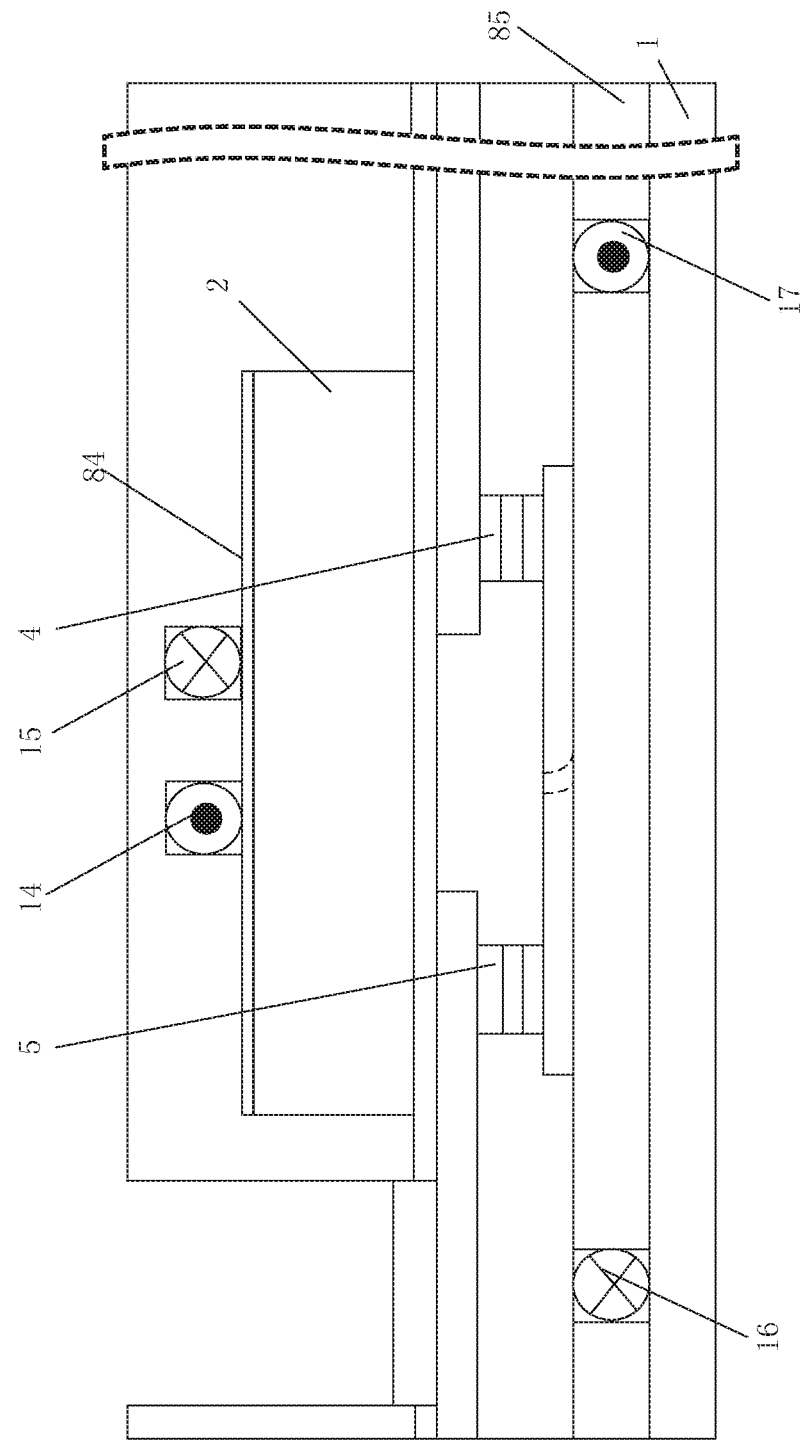
FIG. 16 is a cross-sectional diagram of a three-dimensional calibration coil.

FIG. 16 is a diagram showing a position of the three-dimensional calibration coil 103 on a cross-sectional diagram of the single chip Z-axis magnetoresistive sensor. In the two groups of straight wires, corresponding straight wires 14 and 15 in the two groups of straight wires are located on the surface of the soft ferromagnetic flux concentrator 2, and the other corresponding straight wires 16 and 17 are located on the surfaces of the push magnetoresistive sensing unit string 5 and the pull magnetoresistive sensing unit string 4. 14 and 15 are symmetrically distributed with respect to the Y-axis center line, and 16 and 17 are symmetrically distributed with respect to the Y-axis center line. 14 and 15 are distributed in an area between the push magnetoresistive sensing unit string 5 and the pull magnetoresistive sensing unit string 4, and 16 and 17 are distributed in areas outside the push magnetoresistive sensing unit string 5 and the pull magnetoresistive sensing unit string 4. 14 and 16 form a solenoid coil, 15 and 17 form a solenoid coil, and the two solenoid coils are connected in series and have opposite winding directions. Identical to Embodiment 1, insulation layers 84 and 85 for isolating the three-dimensional coil from other components are also included. In 31 shown in FIG. 16, the straight wires 14 and 15 are located on the surface of the soft ferromagnetic flux concentrator, and 16 and 17 are located on the surfaces of the push magnetoresistive sensing unit string 5 and the pull magnetoresistive sensing unit string 4; in fact, it is also applicable to the three-dimensional calibration coil if positions of the two are exchanged.

Figure 17:
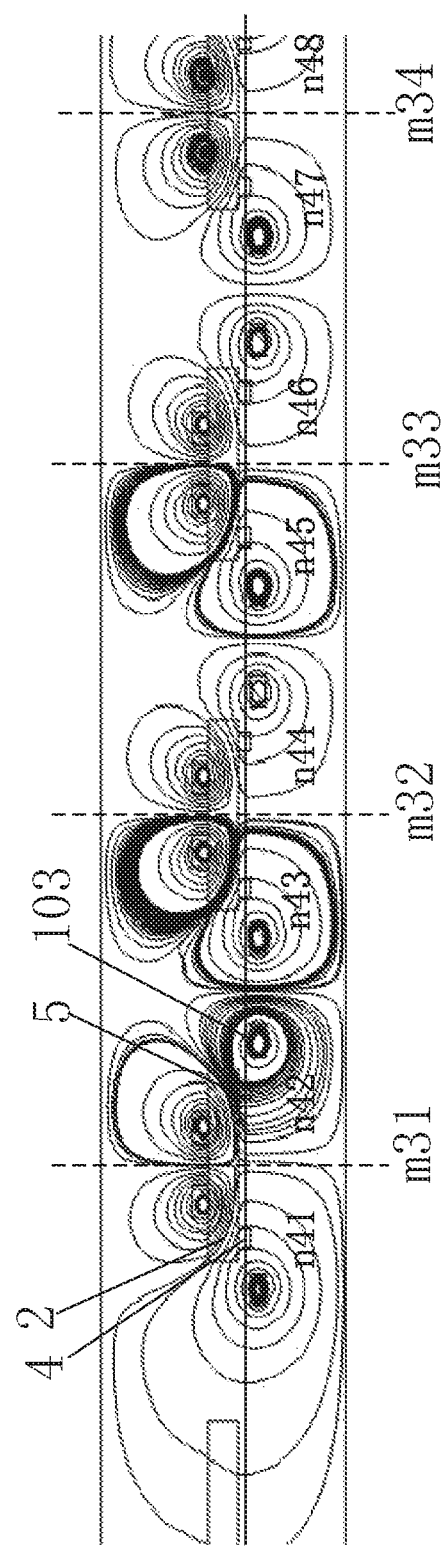
FIG. 17 is a distribution diagram of magnetic field lines of a three-dimensional calibration coil on a single chip Z-axis magnetoresistive sensor.
Figure 18:
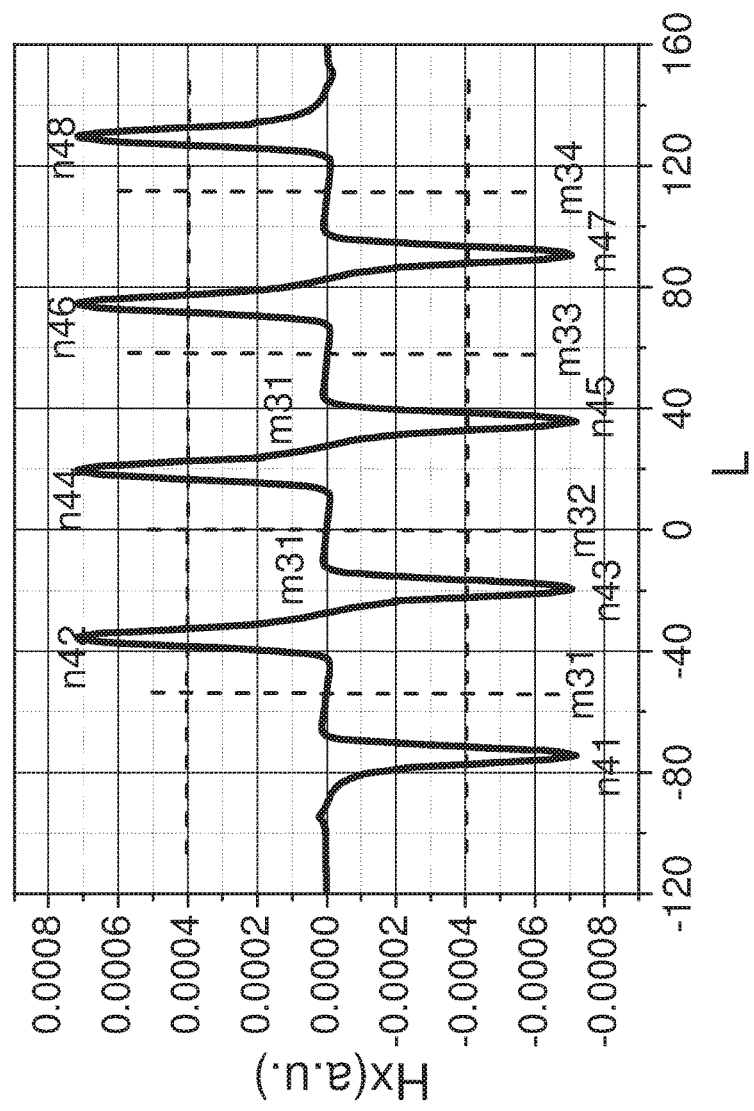
FIG. 18 is a distribution diagram of an X-direction magnetic field of a three-dimensional calibration coil at the position of a magnetoresistive sensing unit.

FIG. 17 and FIG. 18 respectively show distributions of magnetic field lines of the three-dimensional calibration coil 103 on a single chip Z-axis magnetoresistive sensor chip and a distribution diagram of X-axis magnetic fields on the push magnetoresistive sensing unit string 4 and the pull magnetoresistive sensing unit string 5. It can be seen that, the three-dimensional calibration sub-coil 103 forms loops of magnetic field lines at the flux concentrator 2, the push magnetoresistive sensing unit string 4, and the pull magnetoresistive sensing unit string 5, and passes through the soft ferromagnetic flux concentrator, the push magnetoresistive sensing unit string and the pull magnetoresistive sensing unit string sequentially. In FIG. 17, m31-m34 are respectively center lines of the soft ferromagnetic flux concentrators 2, and n41-n48 are respectively positions of the push magnetoresistive sensing unit string 4 and the pull magnetoresistive sensing unit string 5. In FIG. 18, at the center lines m31-m34 of the soft ferromagnetic flux concentrators, X-direction magnetic field components are 0, and as for the push magnetoresistive sensing unit string 4 and the pull magnetoresistive sensing unit string 5, that is, n41 and n42, n43 and n44, n45 and n46, and n47 and n48 have x-direction magnetic field components of identical magnitudes and opposite directions, meeting the requirement of a calibration magnetic field.

Embodiment 3

Figure 19:
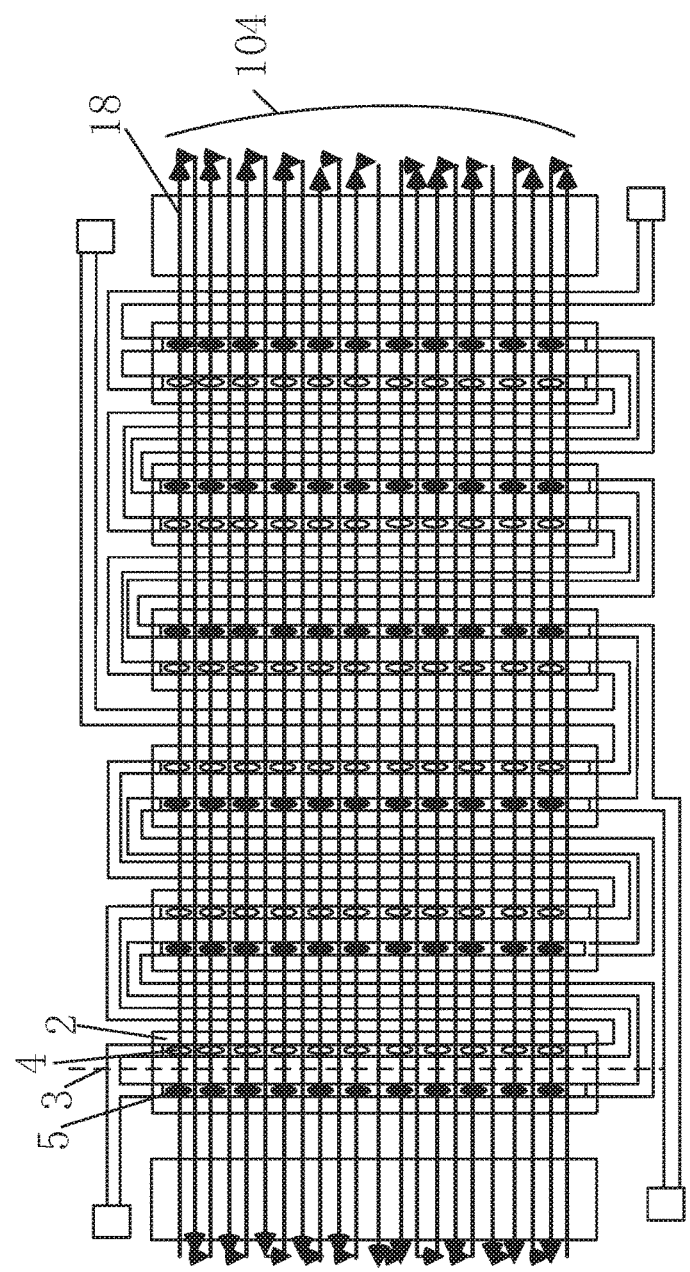
FIG. 19 is a structural diagram of a planar initialization coil.

FIG. 19 is a structural diagram of a planar initialization coil 104, including a plurality of straight wires 18 parallel to an X-axis. The straight wires 18 are perpendicular to the Y-axis center line 3, cross magnetoresistive sensing units along the X direction among the magnetoresistive sensing units on the push magnetoresistive sensing unit string 5 and the pull magnetoresistive sensing unit string 4, and are located at positions right above or right below the magnetoresistive sensing units. The current directions of the straight wires are the same, such that magnetic components generated thereby along a Y direction at the position of the magnetoresistive unit have identical magnitudes and identical directions.

Figure 20:
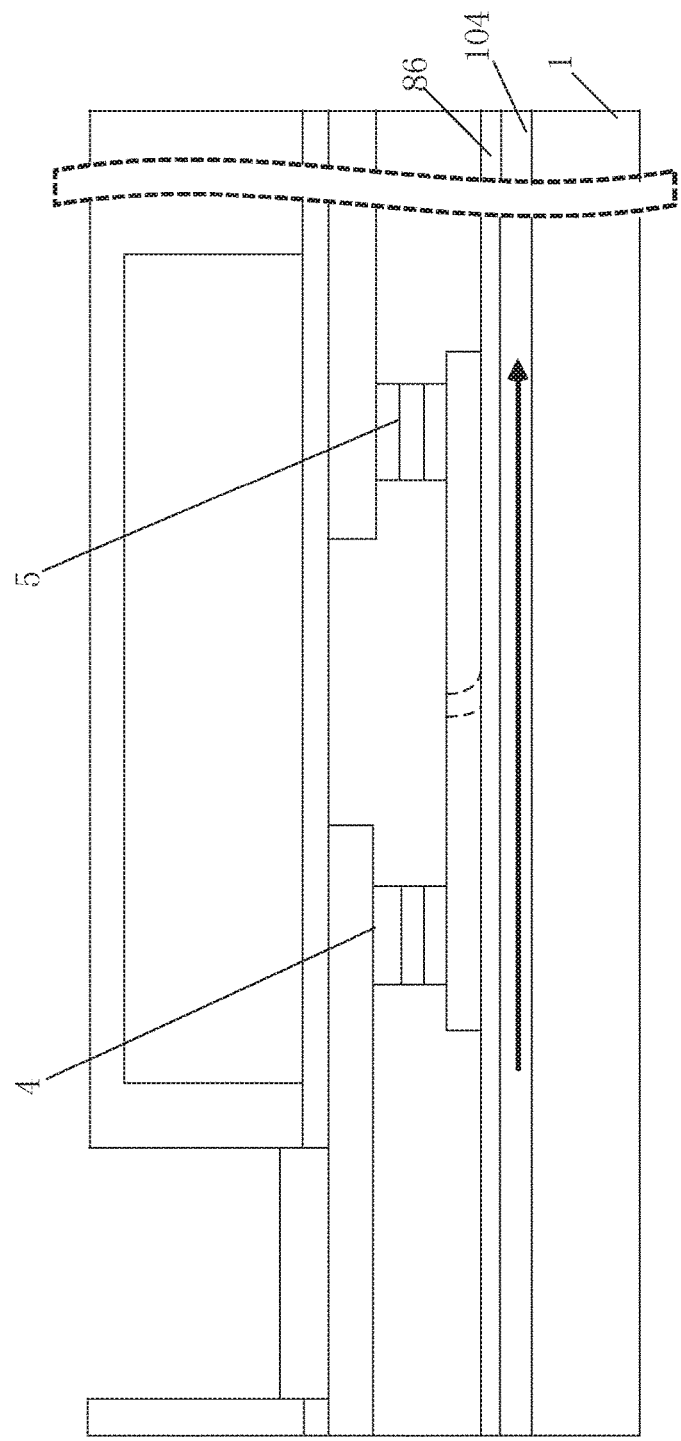
FIG. 20 is a first diagram showing a sectional position of a planar initialization coil.
Figure 21:
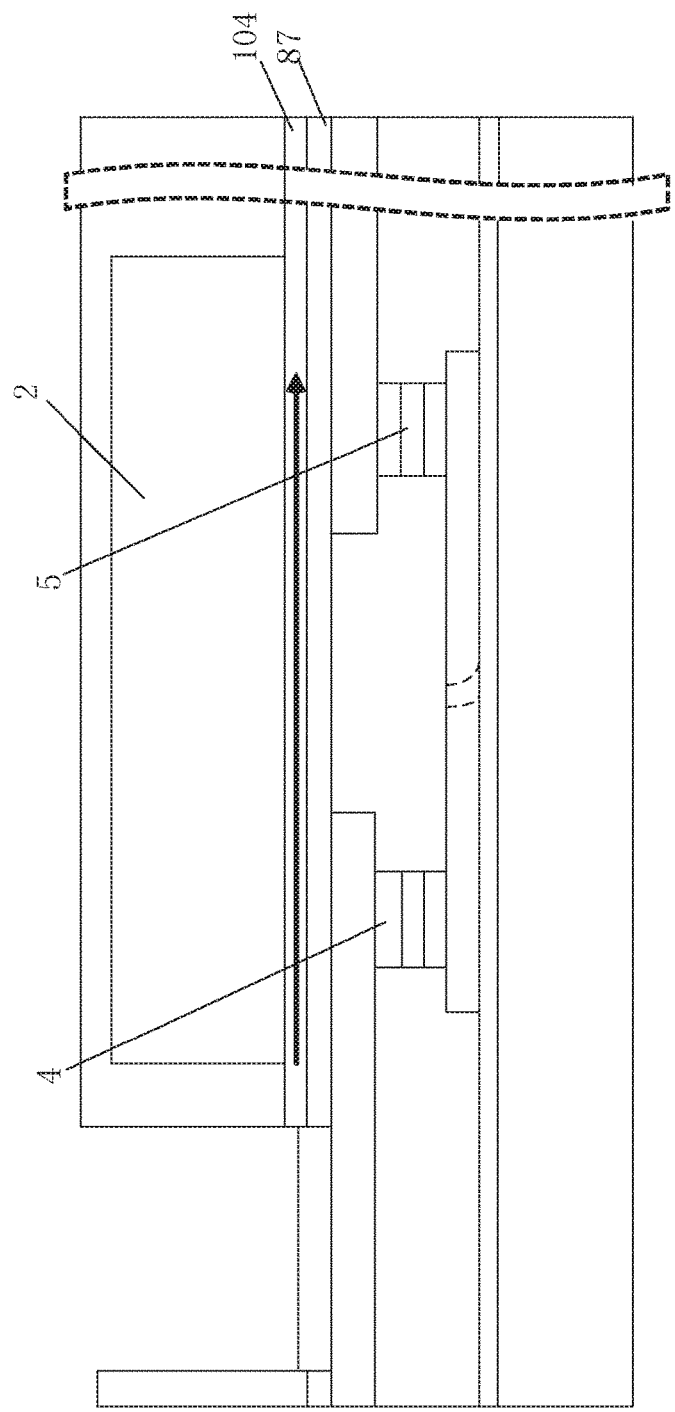
FIG. 21 is a second diagram showing a sectional position of a planar initialization coil.
Figure 22:
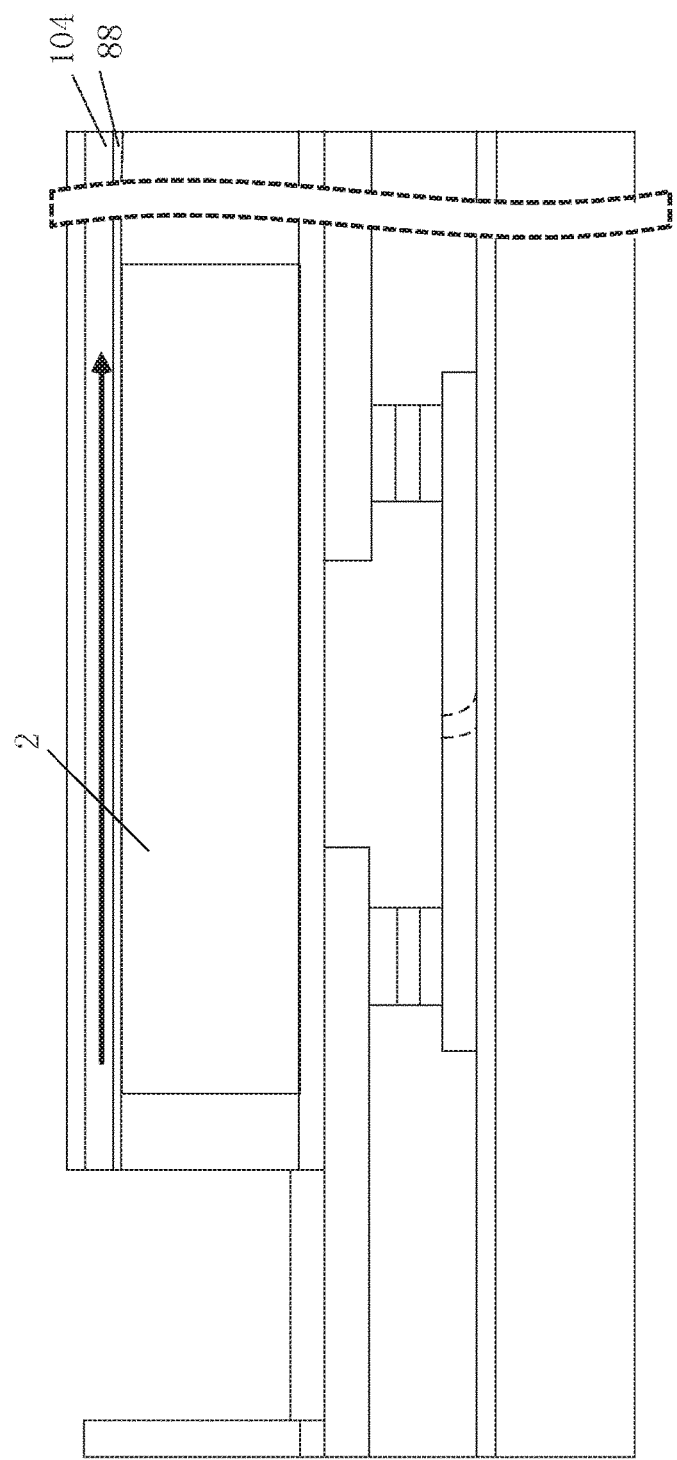
FIG. 22 is a third diagram showing a sectional position of a planar initialization coil.

FIG. 20 to FIG. 22 respectively show cross-sectional diagrams of positions of the planar initialization coil 104 on the single chip Z-axis magnetoresistive sensor. In FIG. 20, the planar initialization coil 104 is located above the substrate 1 and below the push and pull magnetoresistive sensing unit strings 4 and 5, but they can also be located above the push and pull magnetoresistive sensing unit strings 4 and 5. In FIG. 21, the planar initialization coil 104 is located between the soft ferromagnetic flux concentrator 2 and the push and pull magnetoresistive sensing unit strings 4 and 5. In FIG. 22, the planar initialization coil 104 is located above the soft ferromagnetic flux concentrator 2. Like the embodiment of the calibration coil, insulation layers 86, 87 and 88 are used to respectively implement electrical insulation of wire coils, thus isolating the planar initialization coil 104 from peripheral components.

Figure 23:
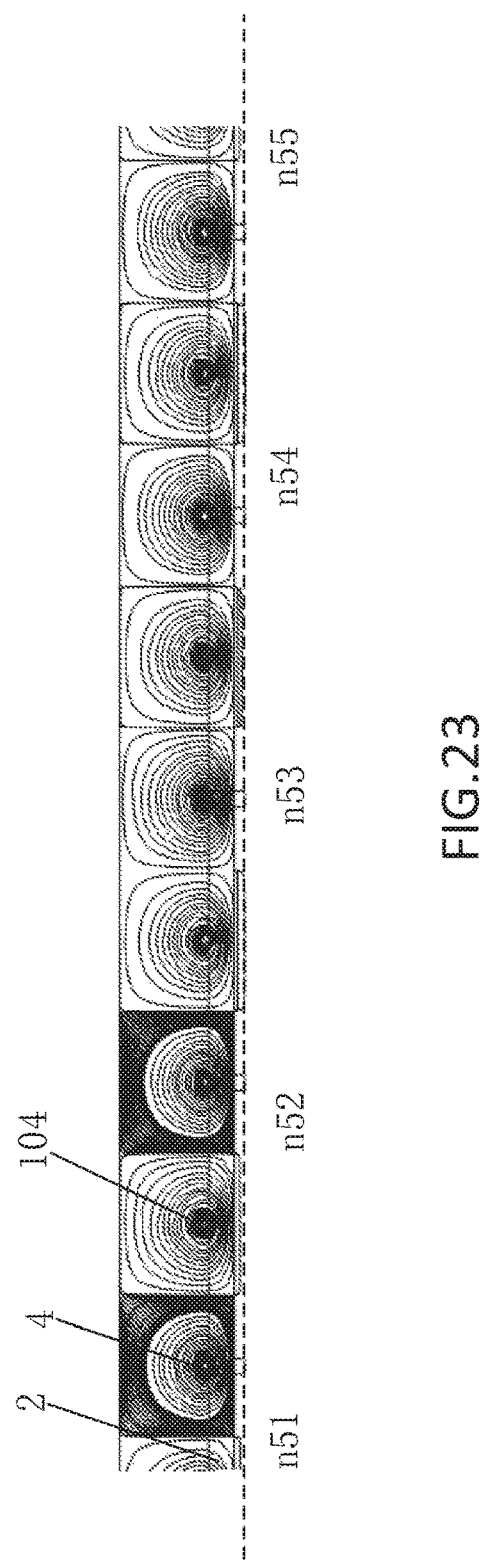
FIG. 23 is a distribution diagram of magnetic field lines of a planar initialization coil on a single chip Z-axis magnetoresistive sensor.
Figure 24:
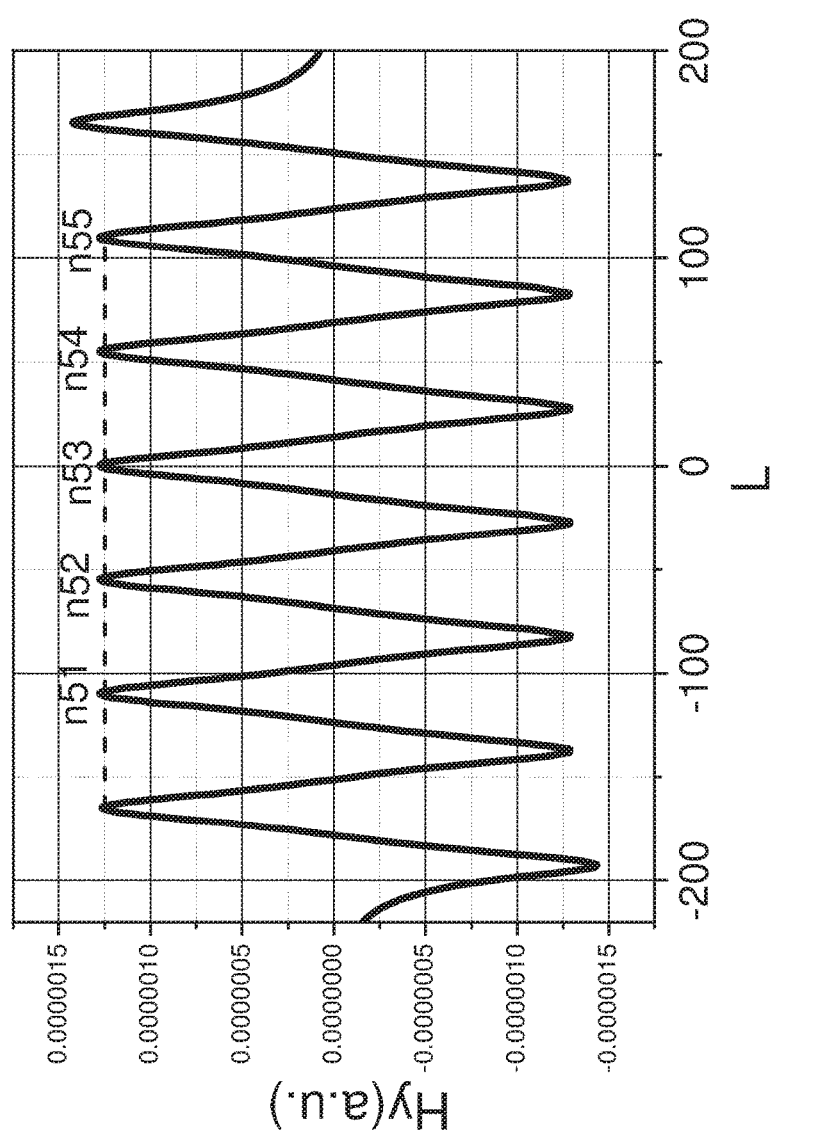
FIG. 24 is a distribution diagram of a Y-direction magnetic field of a planar initialization coil at the position of a magnetoresistive sensing unit.

FIG. 23 is a distribution diagram of magnetic field lines of the planar initialization coil 104 on the Y direction section. It can be seen that each straight wire generates a loop of magnetic field lines on the surface of the soft ferromagnetic flux concentrator 2, wherein n51-n55 are respectively push magnetoresistive sensing unit strings or pull magnetoresistive sensing unit strings located on the soft ferromagnetic flux concentrators 2, and magnetic field components in the Y direction generated thereby at the push and pull magnetoresistive sensing unit strings n51-n55 are shown in FIG. 24. It can be seen that, all magnetoresistive sensing units are located in a uniform Y-direction magnetic field, and they have identical magnetic field amplitudes and identical directions.

Embodiment 4

Figure 25:
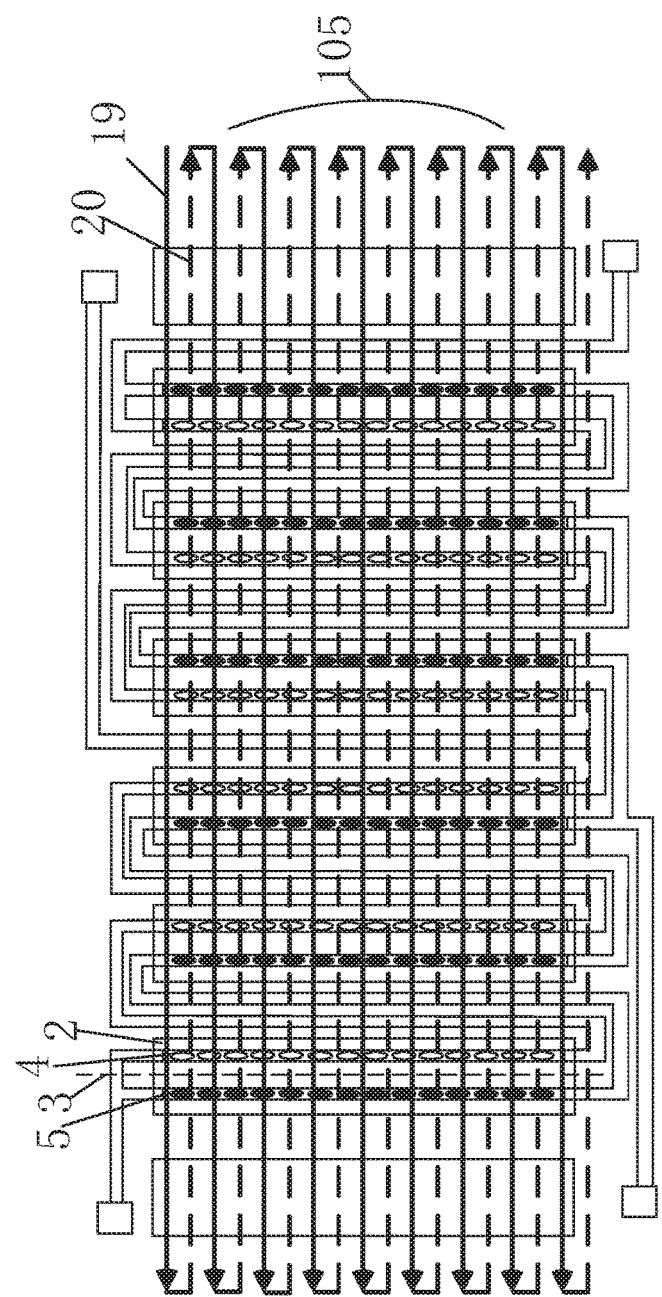
FIG. 25 is a structural diagram of a three-dimensional initialization coil.

FIG. 25 is a structural diagram of a three-dimensional initialization coil 105, including upper and lower groups of straight wires, 19 and 20, parallel to the X-axis. The straight wires 19 and 20 are wound to form solenoid structures by using the soft ferromagnetic flux concentrator 2, the push magnetoresistive sensing unit string 5 and the pull magnetoresistive sensing unit string 4 as magnetic cores, and 19 and 20 have opposite current directions.

Figure 26:
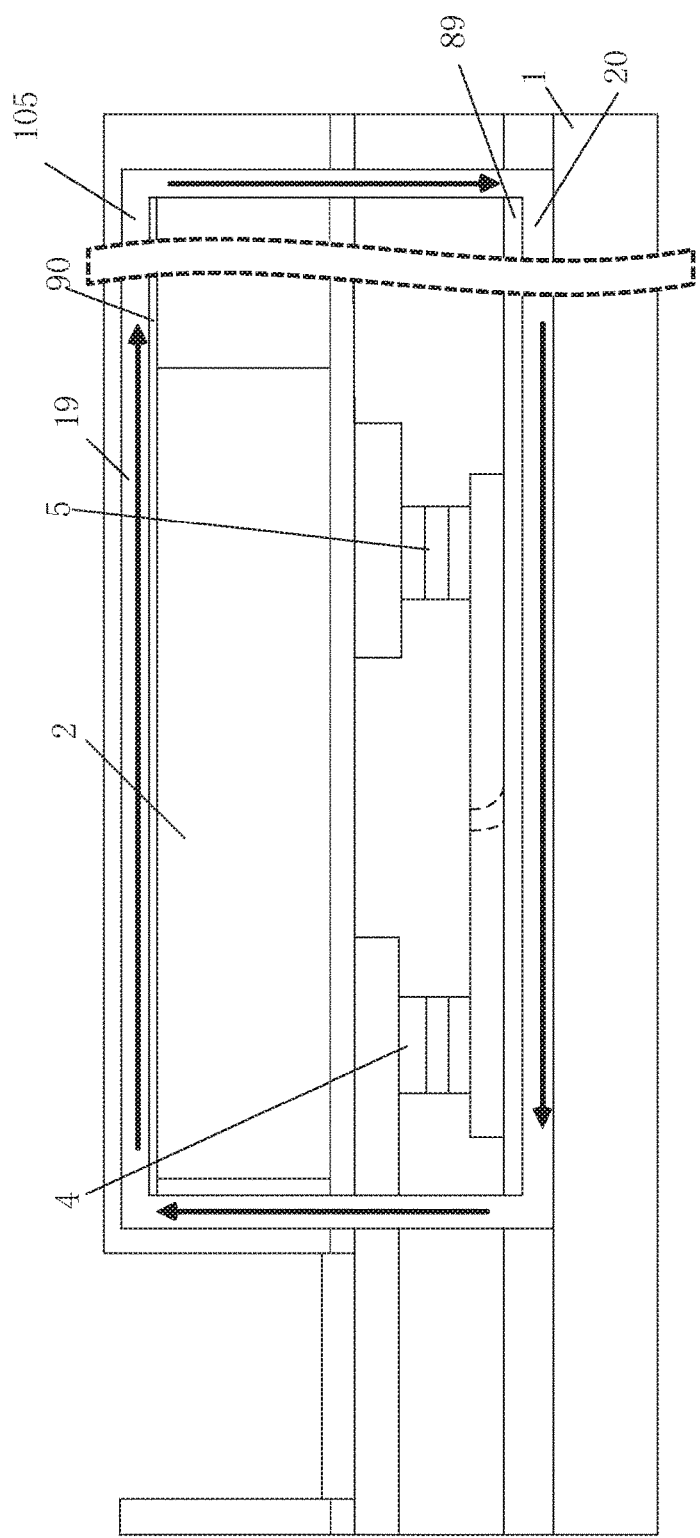
FIG. 26 is a diagram showing a sectional position of a three-dimensional initialization coil.

FIG. 26 is a distribution diagram of the three-dimensional initialization coil 105 on the section of the single chip Z-axis magnetoresistive sensor, where upper and lower groups of straight wires 19 and 20 thereof are respectively located on the surfaces of the soft ferromagnetic flux concentrator 2, the push magnetoresistive sensing unit string 4 and the pull magnetoresistive sensing unit string 5, and are connected by using binding posts on both sides to form a loop. Two insulation layers 89 and 90 are added to be isolated from peripheral components, so as to ensure electrical isolation of the three-dimensional initialization coil 105.

Figure 27:
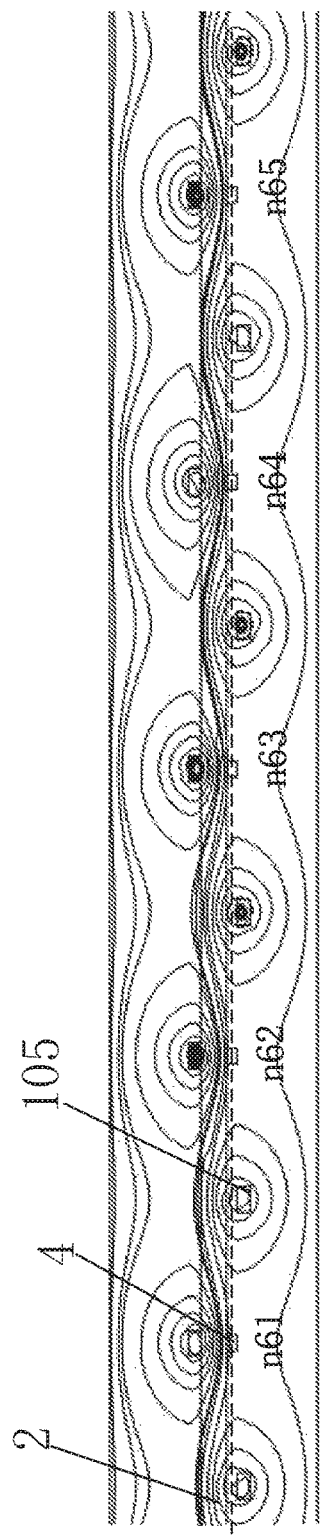
FIG. 27 is a distribution diagram of magnetic field lines of a three-dimensional initialization coil on a single chip Z-axis magnetoresistive sensor.
Figure 28:
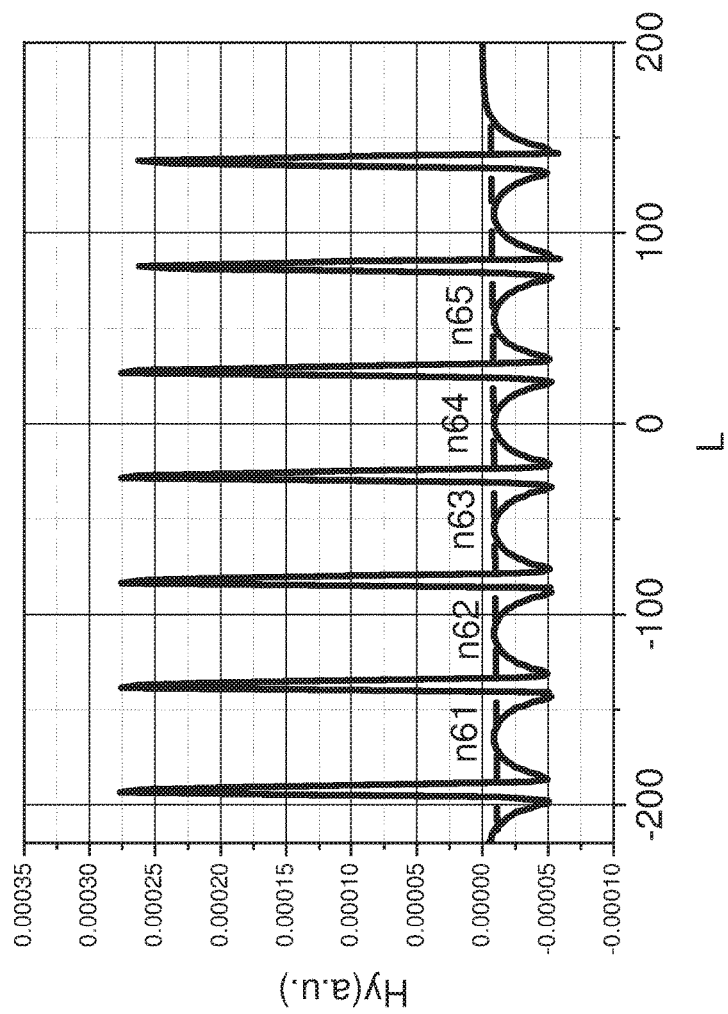
FIG. 28 is a distribution diagram of a Y-direction magnetic field of a three-dimensional initialization coil at the position of a magnetoresistive sensing unit.

FIG. 27 and FIG. 28 show distributions of magnetic field lines generated by solenoid coils formed by the upper and lower straight wires of the three-dimensional initialization coil 105 at the soft ferromagnetic flux concentrator, the push magnetoresistive sensing unit string 4, and the pull magnetoresistive sensing unit string 5 when a current passes through the solenoid coils, wherein n61-n65 are respectively magnetoresistive sensing unit strings. It can be seen from FIG. 28 that, the Y-direction magnetic field is periodically distributed at the magnetoresistive sensing units, wherein Y-direction magnetic field components at positions n61-n65 have identical magnitudes and identical directions. Therefore, as long as upper and lower layers of straight wires are arranged at uniform intervals, obtained magnetic field lines and Y-direction magnetic field distribution generated at the push and pull magnetoresistive sensing unit strings 4 and 5 are periodically distributed, and identical Y-direction magnetic fields are generated at magnetoresistive sensing units of the push magnetoresistive sensing units and pull magnetoresistive sensing units. Therefore, the upper and lower DC wires can be located right above or right below the push and pull magnetoresistive sensing unit strings, and may also be located in other areas. As long as the DC wires are distributed uniformly, and magnetic fields generated at the magnetoresistive sensing unit strings have identical magnitudes and identical directions.

Embodiment 5

The structures of the single planar calibration coil, the three-dimensional calibration coil, the planar initialization coil, and the three-dimensional initialization coils are described above; moreover, position structures thereof on the single chip Z-axis magnetoresistive sensor are further illustrated.

The Z-axis magnetoresistive sensor may be designed to include, in addition to the single chip Z-axis magnetoresistive sensor, it a calibration coil, an initialization coil, or both.

It should be noted that, when both the calibration coil and the initialization coil are included, the planar calibration coil and the planar initialization coil may be located at the same position, for example, located above the substrate and below the push and pull magnetoresistive sensing units, or located between the soft ferromagnetic flux concentrator and the push and pull magnetoresistive sensing units, or located above the soft ferromagnetic flux concentrator, and may also be located at a free combination of any two positions in the above three positions. For the three-dimensional calibration coil and three-dimensional initialization coil, a fixed winding method is provided, that is, winding by using the soft ferromagnetic flux concentrator and the push and pull magnetoresistive sensing units as centers. As for the combination of the three-dimensional coil and the planar coil, the three-dimensional coil is located at a fixed position, and the planar coil is located at any position in the above three positions. In the case where both coils are three-dimensional coils, there is only one combination.

Figure 29:
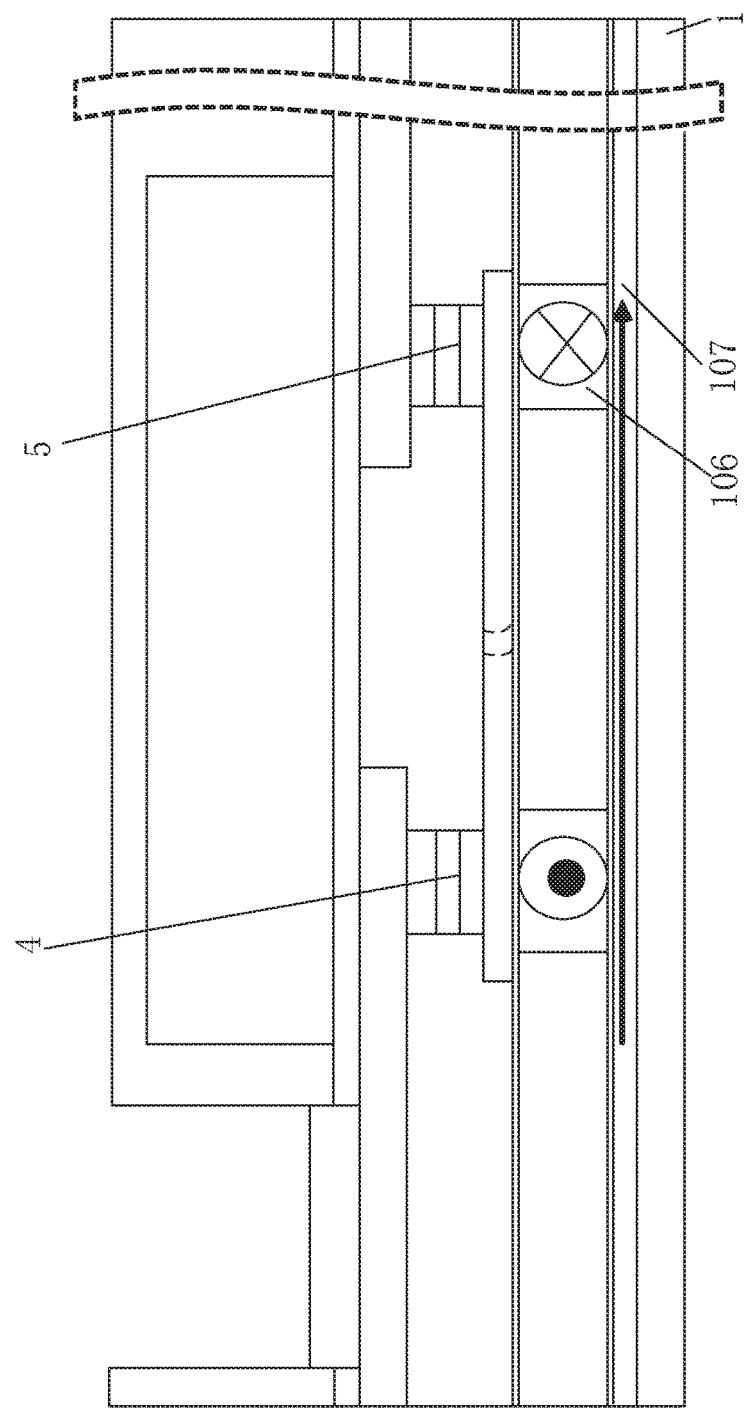
FIG. 29 is a first cross-sectional diagram of an initialization coil and a calibration coil on a single chip Z-axis magnetoresistive sensor.
Figure 30:
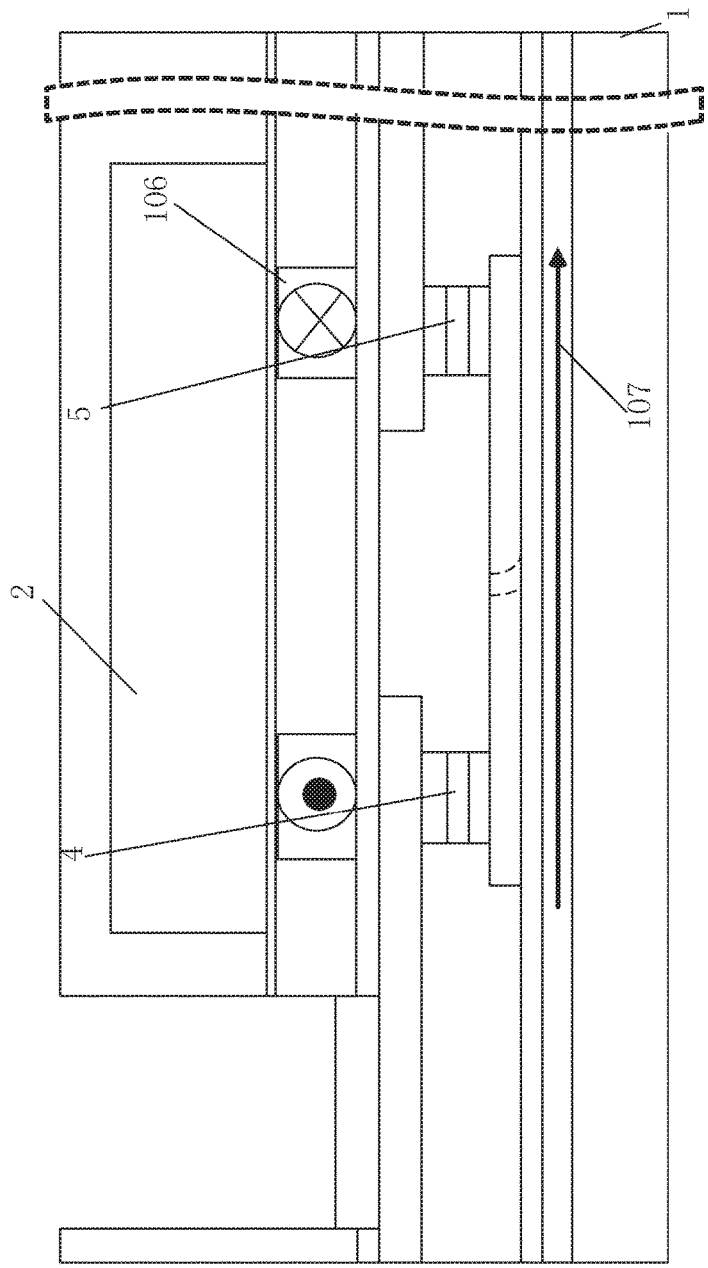
FIG. 30 is a second cross-sectional diagram of an initialization coil and a calibration coil on a single chip Z-axis magnetoresistive sensor.
Figure 31:
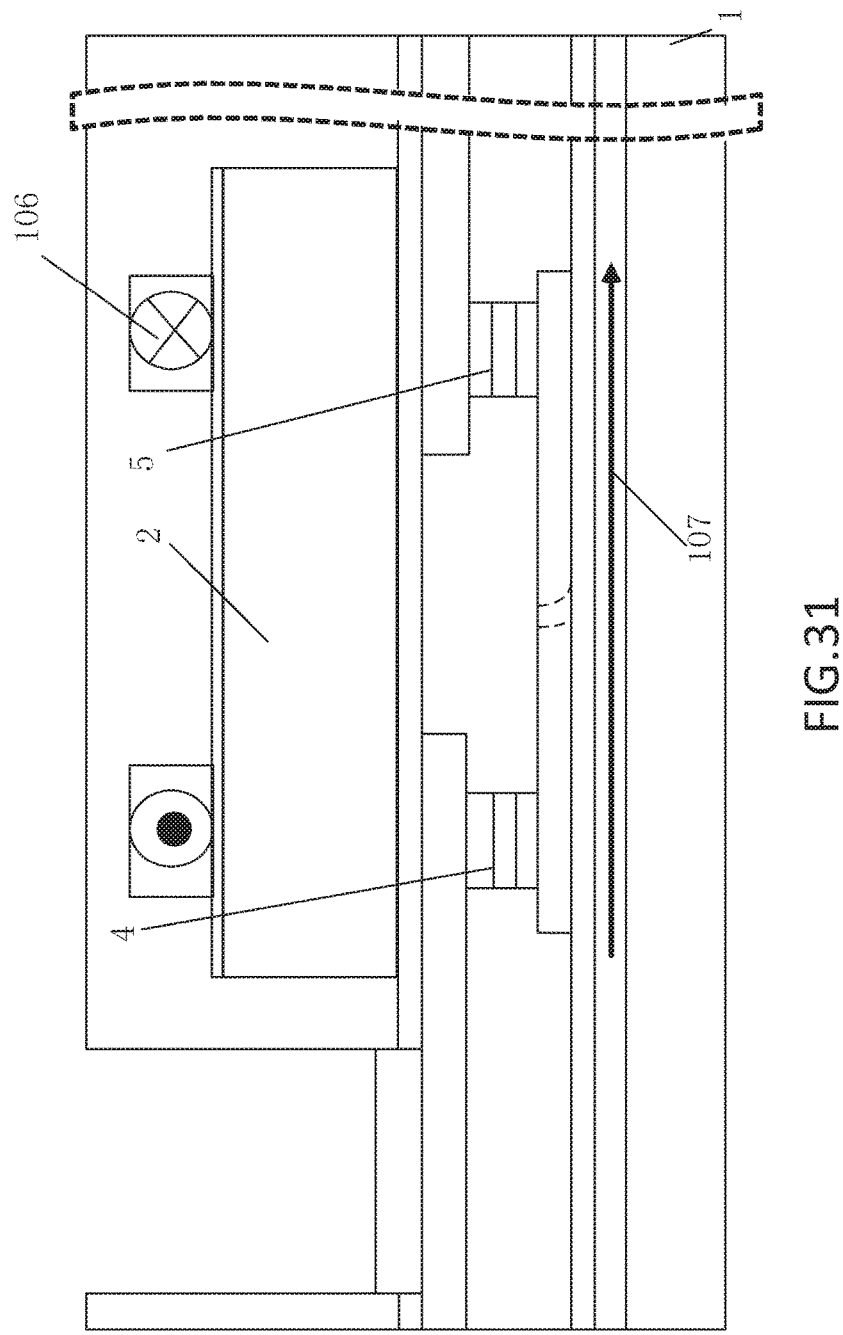
FIG. 31 is a third cross-sectional diagram of an initialization coil and a calibration coil on a single chip Z-axis magnetoresistive sensor.

For ease of illustration, only three typical combination structures of the planar calibration coil and the planar initialization coil are provided, as shown in FIG. 29 to FIG. 31. As shown in FIG. 29, the planar calibration coil 106 and the planar initialization coil 107 are both located above the substrate 1 and between the push and pull magnetoresistive sensing unit strings 4 and 5. In FIG. 30, the planar calibration coil 106 is located between the soft ferromagnetic flux concentrator 2 and the push and pull magnetoresistive sensing unit strings 4 and 5, and the planar initialization coil 107 is located above the substrate 1 and between the push and pull magnetoresistive sensing unit strings 4 and 5. In FIG. 31, the planar calibration coil 106 is located above the soft ferromagnetic flux concentrator 2, and the planar initialization coil 107 is located above the substrate 1 and between the push and pull magnetoresistive sensing unit strings 4 and 5.

Moreover, during actual use, a DC current is charged into the calibration coil to generate a DC magnetic field to replace an external magnetic field. The calibration manner may be predetermining a DC current value, and observing a difference between a standard value and an output value of the single chip Z-axis magnetoresistive sensor at the current value, or predetermining a scan value of a DC current value, and observing a difference between an output curve of the single chip Z-axis magnetoresistive sensor and a standard curve, to determine whether the chip is qualified.

As for the initialization coil, the charged circuit amplitude needs to generate a saturation value higher than the free layer, such that the magnetization state is restored to the original state, and the initialization current may be a pulse or DC circuit.

The above embodiments are merely used for illustrating technical concepts and characteristics of the invention, and are intended to enable those skilled in the technology to understand the content of the invention and implement accordingly, rather than limiting the protection scope of the invention. Equivalent changes or modifications made according to the spirit of the invention should be incorporated into the protection scope of the invention.

The invention claimed is:

1. A single chip Z-axis linear magnetoresistive sensor with a calibration/initialization coil comprising:
   a single chip Z-axis linear magnetoresistive sensor, and
   a calibration coil or/and an initialization coil, wherein the single chip Z-axis linear magnetoresistive sensor comprises a soft ferromagnetic flux concentrator and a magnetoresistive sensing unit array that are located on a substrate, wherein the soft ferromagnetic flux concentrator is elongated, and has a long axis along a Y direction and a short axis along an X direction, wherein the magnetoresistive sensing units are TMR sensing units, magnetization directions of pinned layers are all along the X direction, magnetization directions of free layers thereof are all along the Y direction;

wherein the magnetoresistive sensing units are electrically connected to form a push magnetoresistive sensing unit string and a pull magnetoresistive sensing unit string along the Y direction, which are respectively located on two sides of a Y-axis center line above or below the surface of a corresponding soft ferromagnetic flux concentrator, and have a same distance from the Y-axis center line; and the push magnetoresistive sensing unit string and the pull magnetoresistive sensing unit string are electrically connected to form a push-pull magnetoresistive sensor, wherein, when a Z-direction external magnetic field is measured, the soft ferromagnetic flux concentrator distorts the Z-direction external magnetic field into two magnetic field components that are parallel and anti-parallel to the magnetization direction of the pinned layer, have identical amplitudes, and are applied to the push magnetoresistive sensing unit string and the pull magnetoresistive sensing unit string respectively, wherein the calibration coil comprises straight wires parallel to the push magnetoresistive sensing unit string and the pull magnetoresistive sensing unit string, and generates calibration magnetic fields at the push magnetoresistive sensing unit string and the pull magnetoresistive sensing unit string respectively, the calibration magnetic field having magnetic field components that have identical intensity but are respectively parallel and anti-parallel to the magnetization direction of the pinned layer; and wherein the initialization coil comprises straight wires parallel to the magnetization direction of the pinned layer of the magnetoresistive sensing unit, and generates a uniform initializing magnetic field having magnetic field components parallel to the magnetization direction of the free layer at all the magnetoresistive sensing units.

2. The single chip Z-axis linear magnetoresistive sensor with a calibration/initialization coil according to claim 1, wherein the calibration coil is a planar calibration coil, the straight wires of the planar calibration coil are one-to-one corresponding to the push magnetoresistive sensing unit string and the pull magnetoresistive sensing unit string, and are located on the same side of the Y-axis center line of the soft ferromagnetic flux concentrator as the push magnetoresistive sensing unit string and the pull magnetoresistive sensing unit string respectively; and the straight wire corresponding to the push magnetoresistive sensing unit string and the straight wire corresponding to the pull magnetoresistive sensing unit string have currents in opposite directions.

3. The single chip Z-axis linear magnetoresistive sensor with a calibration/initialization coil according to claim 2, wherein a distance between the straight wire of the planar calibration coil and the Y-axis center line of the soft ferromagnetic flux concentrator is 0 to ($\frac{1}{2}$*Lx+$\frac{1}{2}$*Lgap), wherein Lx is the width of the flux concentrator, and Lgap is the width of a gap between adjacent flux concentrators.

4. The single chip Z-axis linear magnetoresistive sensor with a calibration/initialization coil according to claim 3, wherein when the distance between the straight wire of the planar calibration coil and the Y-axis center line of the corresponding soft ferromagnetic flux concentrator is 0 to $\frac{1}{2}$*Lx, the planar coil is located above the substrate of the single chip Z-axis linear magnetoresistive sensor and below a magnetoresistive sensing unit, between a magnetoresistive sensing unit and a soft ferromagnetic flux concentrator, or above a soft ferromagnetic flux concentrator.

5. The single chip Z-axis linear magnetoresistive sensor with a calibration/initialization coil according to claim 3, wherein when the distance between the straight wire of the planar calibration coil and the Y-axis center line of the corresponding soft ferromagnetic flux concentrator is $\frac{1}{2}$*Lx to ($\frac{1}{2}$*Lx+$\frac{1}{2}$*Lgap), the planar calibration coil is located above the substrate of the single chip Z-axis linear magnetoresistive sensor and below a magnetoresistive sensing unit, between a magnetoresistive sensing unit and a soft ferromagnetic flux concentrator, or in a gap between soft ferromagnetic flux concentrators.

6. The single chip Z-axis linear magnetoresistive sensor with a calibration/initialization coil according to claim 1, wherein the calibration coil is a three-dimensional calibration coil wound around the soft ferromagnetic flux concentrator and the magnetoresistive sensing unit, wherein the three-dimensional calibration coil comprises a plurality of three-dimensional calibration sub-coils electrically connected in series to each other, and each of the soft ferromagnetic flux concentrator, the push magnetoresistive sensing unit string, and the pull magnetoresistive sensing unit string corresponds to one of the three-dimensional calibration sub-coils, wherein the three-dimensional calibration sub-coil comprises a first group of straight wires and a second group of straight wires which are parallel to the Y-axis center line of the soft ferromagnetic flux concentrator, and the first group of straight wires and the second group of straight wires are symmetrically distributed on two sides of the Y-axis center line of the soft ferromagnetic flux concentrator, wherein the first group/second group of straight wires comprises two straight wires, and the two straight wires of the first group/second group of straight wires are located respectively on the surfaces of the soft ferromagnetic flux concentrator or the push magnetoresistive sensing unit string and the pull magnetoresistive sensing unit string, wherein one straight wire in the first group of straight wires and one straight wire in the second group of straight wires are symmetric to the Y-axis center line and distributed in an area between the push and pull magnetoresistive sensing unit strings, the other straight wire in the first group of straight wires and the other straight wire in the second group of straight wires are symmetric to the Y-axis center line and distributed in areas outside the push magnetoresistive sensing unit string and the pull magnetoresistive sensing unit string, and wherein the first group of straight wires form a first three-dimensional solenoid coil, the second group of straight wires form a second three-dimensional solenoid coil, and the first and second three-dimensional solenoid coils have opposite winding directions and are electrically connected in series to each other, wherein one of the three-dimensional solenoid coils generates a magnetic field parallel to the X direction, and the other generates a magnetic field in a −X direction.

7. The single chip Z-axis linear magnetoresistive sensor with a calibration/initialization coil according to claim 1, wherein the initialization coil is a planar initialization coil, the planar initialization coil comprises a plurality of straight wires perpendicular to the Y-axis center line of the soft ferromagnetic flux concentrator and electrically connected in series, wherein the straight wires are located right above or right below a magnetoresistive sensing unit row of the Z-axis linear sensor along the X-axis direction, and have identical current directions.

8. The single chip Z-axis linear magnetoresistive sensor with a calibration/initialization coil according to claim 1, wherein the initialization coil is a three-dimensional initialization coil, the three-dimensional initialization coil comprises a plurality of first groups of straight wires and second groups of straight wires that are parallel to a magnetoresistive sensing unit row of the magnetoresistive sensing unit array along the X-axis direction,
wherein the first groups of straight wires and the second groups of straight wires are respectively located on the surfaces of the soft ferromagnetic flux concentrators and the magnetoresistive sensing units, and the first groups of straight wires and the second groups of straight wires have opposite current directions, and are connected to form a solenoid coil.

9. The single chip Z-axis linear magnetoresistive sensor with a calibration/initialization coil according to claim 1, wherein the initialization coil and the calibration coil are made of high-conductivity materials, and the high-conductivity materials are Cu, Au, or Ag.

10. The single chip Z-axis linear magnetoresistive sensor with a calibration/initialization coil according to claim 9, wherein the initialization coil/calibration coil and the single chip Z-axis magnetoresistive sensor are isolated by using electric insulation materials, and the insulation materials are $SiO_2$, $Al_2O_3$, $Si_3N_4$, polyimide, or photoresist.

11. The single chip Z-axis linear magnetoresistive sensor with a calibration/initialization coil according to claim 1,
wherein the calibration coil comprises a positive port and a negative port, and when a current passes through the positive port and the negative port, the amplitude of a calibration magnetic field generated thereby is within a linear working area of the push magnetoresistive sensing unit string and the pull magnetoresistive sensing unit string.

12. The single chip Z-axis linear magnetoresistive sensor with a calibration/initialization coil according to claim 11,
wherein the current in the calibration coil is a set current value or a plurality of set current values.

13. The single chip Z-axis linear magnetoresistive sensor with a calibration/initialization coil according to claim 1,
wherein the initialization coil comprises two ports, and the magnitude of the initializing magnetic field is higher than a saturated magnetic field value of the free layer.

14. The single chip Z-axis linear magnetoresistive sensor with a calibration/initialization coil according to claim 13,
wherein the current in the initialization coil is a pulse current or a DC current.

* * * * *